United States Patent
Hsu et al.

(10) Patent No.: US 12,002,770 B2
(45) Date of Patent: Jun. 4, 2024

(54) POWER MANAGEMENT SEMICONDUCTOR PACKAGE AND MANUFACTURING METHOD THEREOF

(71) Applicant: TAIWAN SEMICONDUCTOR MANUFACTURING COMPANY LTD., Hsinchu (TW)

(72) Inventors: Ying-Chih Hsu, Hsinchu (TW); Wen-Shiang Liao, Miaoli County (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 673 days.

(21) Appl. No.: 16/787,644

(22) Filed: Feb. 11, 2020

(65) Prior Publication Data
US 2021/0249366 A1    Aug. 12, 2021

(51) Int. Cl.
*H01L 23/64* (2006.01)
*H01L 21/56* (2006.01)
(Continued)

(52) U.S. Cl.
CPC .......... *H01L 23/645* (2013.01); *H01L 21/565* (2013.01); *H01L 23/31* (2013.01);
(Continued)

(58) Field of Classification Search
CPC ............. H01L 23/645; H01L 23/53204; H01L 23/5386; H01L 23/5385; H01L 23/31;
(Continued)

(56) References Cited

U.S. PATENT DOCUMENTS 9,000,584 B2    4/2015 Lin et al.
9,048,222 B2    6/2015 Hung et al.
(Continued)

FOREIGN PATENT DOCUMENTS

DE        112019003318 T5 *  3/2021   .......... H01L 23/645

OTHER PUBLICATIONS

U.S. Appl. No. 16/727,930, filed Dec. 12, 2019.
U.S. Appl. No. 16/354,142, filed Mar. 14, 2019.

*Primary Examiner* — Fazli Erdem
(74) *Attorney, Agent, or Firm* — WPAT LAW; Anthony King

(57) ABSTRACT

A package includes first and second redistribution structures, a die, a permalloy structure, a molding material and a plurality of through vias. The first redistribution structure includes a first metal pattern. The die is disposed over the first redistribution structure. The molding material is disposed over the first redistribution structure and surrounds the die and the permalloy structure. The second redistribution structure is disposed over the die, the permalloy structure and the molding material, and includes a second metal pattern. The through vias penetrate the molding material and connects the first metal pattern to the second metal pattern. The permalloy structure includes a first member and a second member isolated from the first member, the first member and the second member are surrounded by the plurality of through vias and sandwiched between the first metal pattern and the second metal pattern. A method for forming a package is also provided.

20 Claims, 24 Drawing Sheets

(51) Int. Cl.
*H01L 23/31* (2006.01)
*H01L 23/532* (2006.01)
*H01L 23/538* (2006.01)
*H01L 49/02* (2006.01)

(52) U.S. Cl.
CPC .... *H01L 23/53204* (2013.01); *H01L 23/5384* (2013.01); *H01L 23/5385* (2013.01); *H01L 23/5386* (2013.01); *H01L 28/10* (2013.01)

(58) Field of Classification Search
CPC . H01L 23/5384; H01L 23/532; H01L 23/538; H01L 21/565; H01L 28/10; H01L 21/56; H01L 49/02; H01L 21/6835; H01L 24/19; H01L 2924/68345; H01L 2924/30107; H01L 21/568; H01L 2224/92244; H01L 2224/04105; H01L 2924/19042; H01L 2221/68359; H01L 2221/68372; H01L 2224/24195; H01L 2224/12105; H01L 2224/73267; H01L 2924/19105; H01L 2224/32225; H01L 21/561; H01L 23/3128; H01L 23/49816; H01L 23/5389; H01F 17/0033; H01F 41/046
USPC .......................................................... 257/531
See application file for complete search history.

(56) References Cited

U.S. PATENT DOCUMENTS

| | | |
|---|---|---|
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,799,721 B2 * | 10/2017 | Kuo ............... H01L 23/645 |
| 2018/0138126 A1 * | 5/2018 | Chen .............. H01L 23/50 |
| 2020/0098621 A1 * | 3/2020 | Bharath ........... H01L 23/13 |
| 2020/0295121 A1 * | 9/2020 | Liao ............. H01F 17/0006 |
| 2020/0312766 A1 * | 10/2020 | Bhagavat ....... H01L 23/5227 |

* cited by examiner

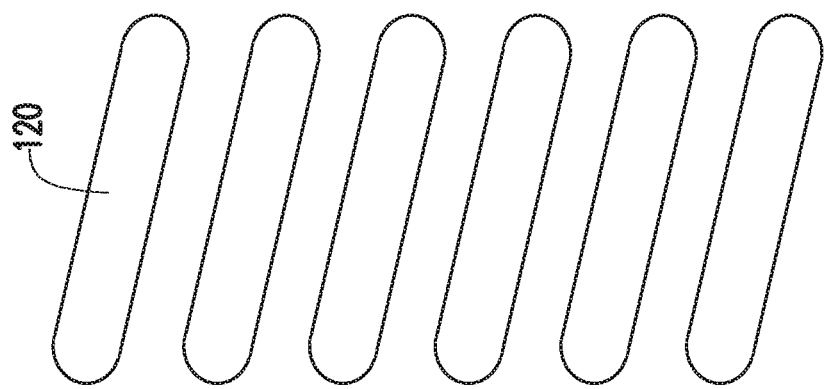
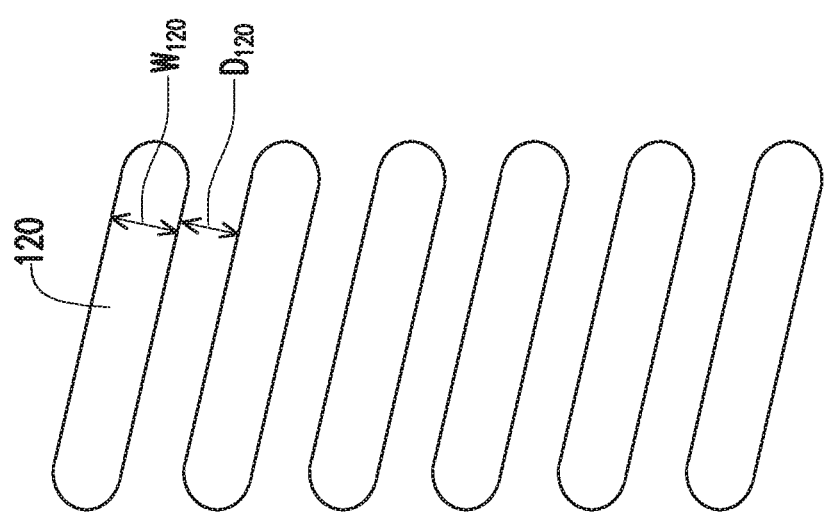
FIG. 2

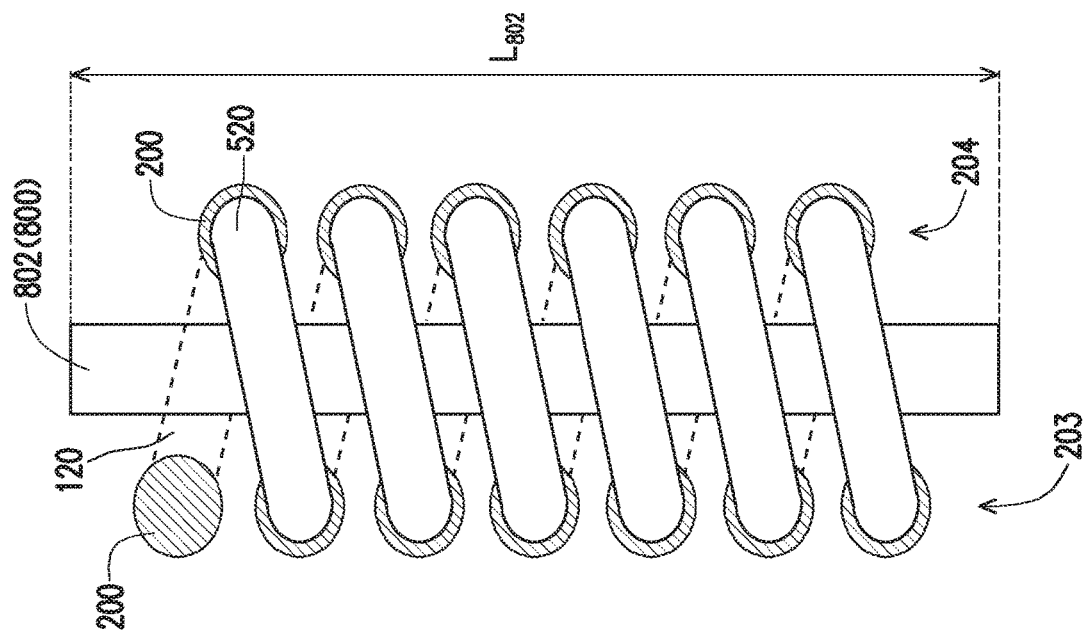
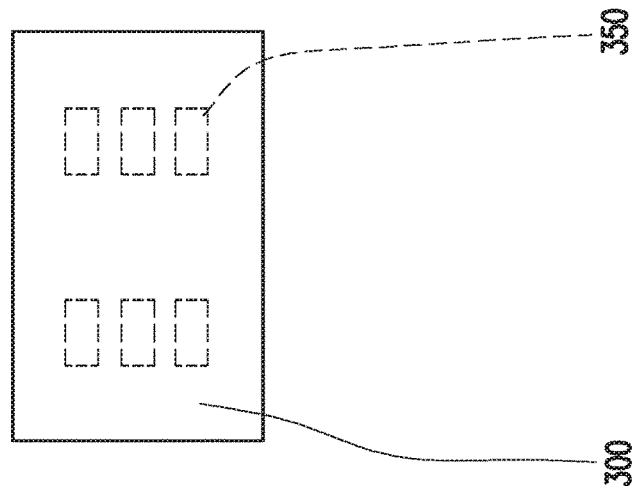
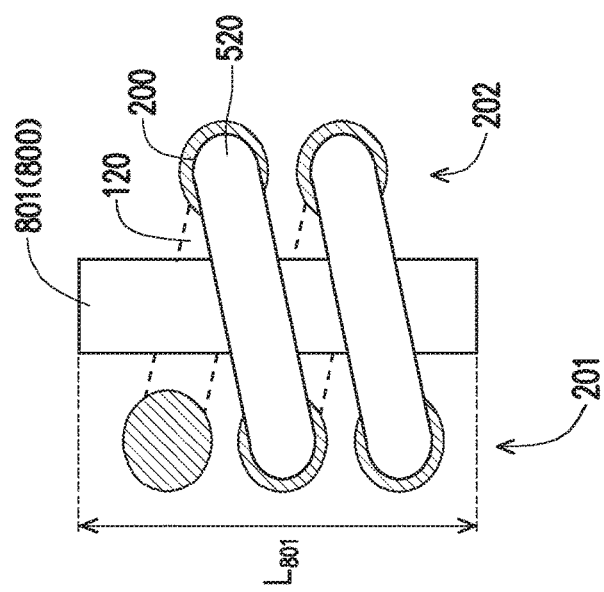
FIG. 7

POWER MANAGEMENT SEMICONDUCTOR PACKAGE AND MANUFACTURING METHOD THEREOF

BACKGROUND

Semiconductor devices and integrated circuits used in a variety of electronic apparatus, such as cell phones and other mobile electronic equipment, are typically manufactured on a single semiconductor wafer. The dies of the wafer may be processed and packaged with other semiconductor devices or dies at the wafer level, and various technologies and applications have been developed for the wafer-level packaging. For example, voltage regulators play significant roles in power management of electronic devices. Integration of voltage regulators and wafer-level packaging has become a challenge in the field.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2 is a schematic top view illustrating the conductive patterns shown in FIG. 1A.

FIGS. 6 to 8 are schematic top views illustrating inductors, cores and a die in semiconductor packages in accordance with different embodiments of the present disclosure.

DETAILED DESCRIPTION

Figure 1:
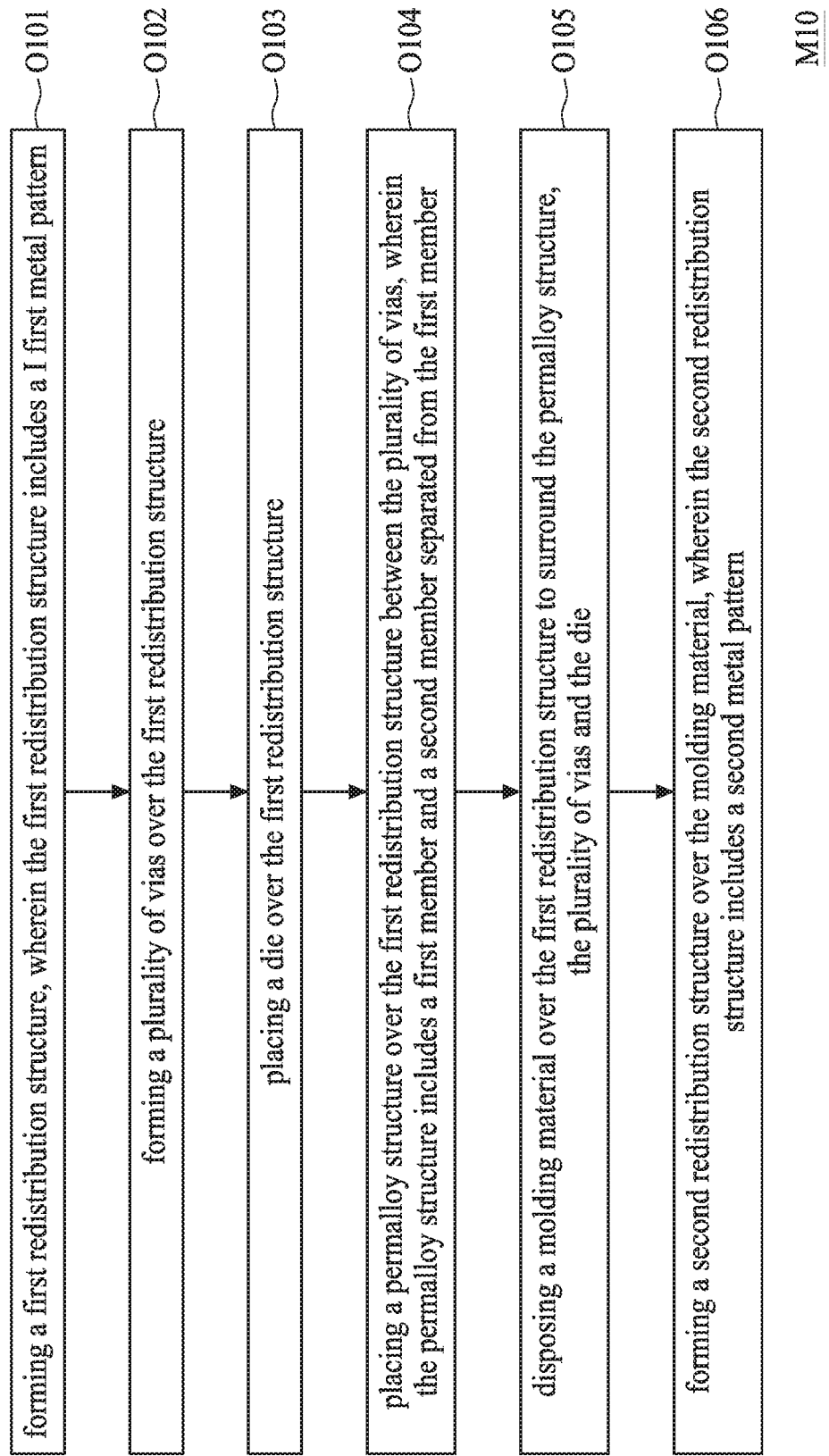
FIG. 1 is a flow chart illustrating a method for forming a package in accordance with some embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a flow chart of a method M10 for forming a package 10 in accordance with some embodiments of the disclosure. The method M10 includes several operations: (O101) forming a first redistribution structure, wherein the first redistribution structure includes a first metal pattern; (O102) forming a plurality of vias over the first redistribution structure; (O103) placing a die over the first redistribution structure; (O104) placing a permalloy structure over the first redistribution structure between the plurality of vias, wherein the permalloy structure includes a first member and a second member separated from the first member; (O105) disposing a molding material over the first redistribution structure to surround the permalloy structure, the plurality of vias and the die; and (O106) forming a second redistribution structure over the molding material, wherein the second redistribution structure includes a second metal pattern.

Each of the first member and the second member is wound by the plurality of vias, the first metal pattern and the second metal pattern.

Figure 1A:
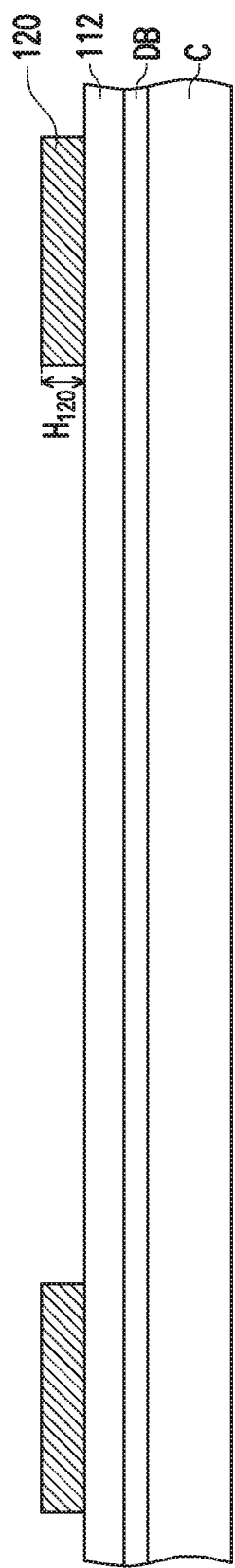
FIG. 1A to FIG. 1R are schematic cross-sectional views of one or more stages of the method in accordance with some embodiments of the disclosure.
Figure 1B:
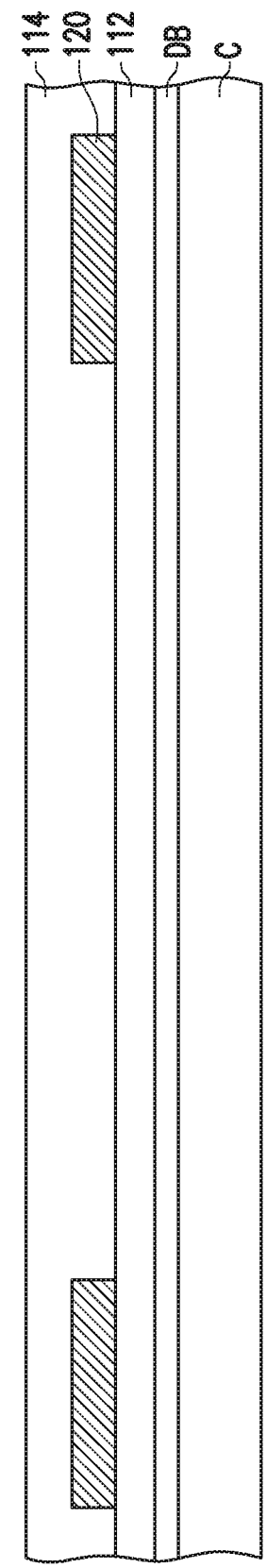
Figure 1C:
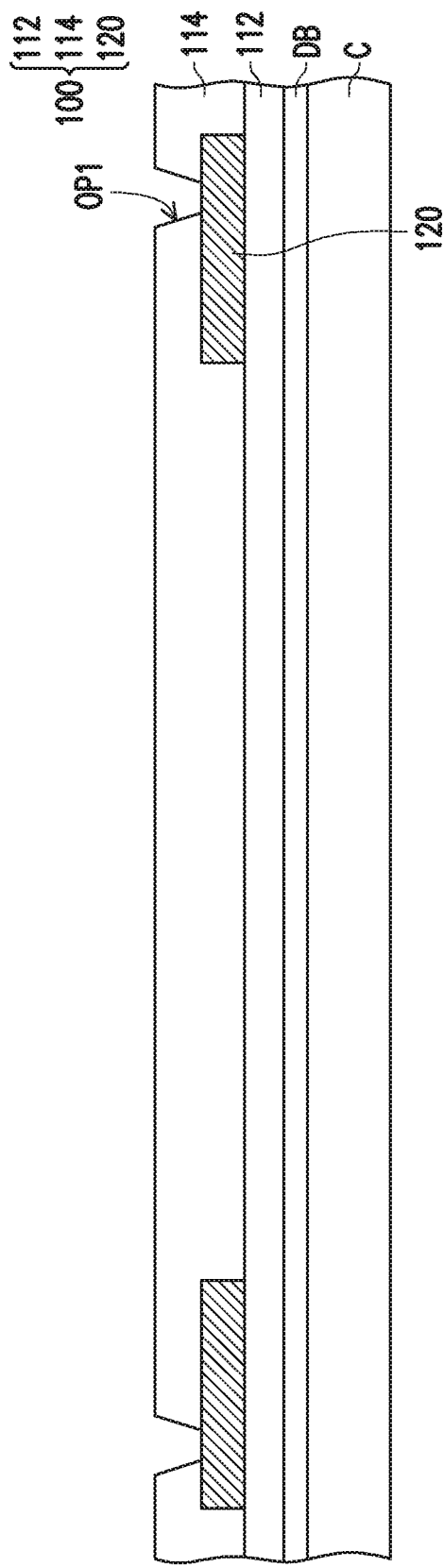
Figure 1D:
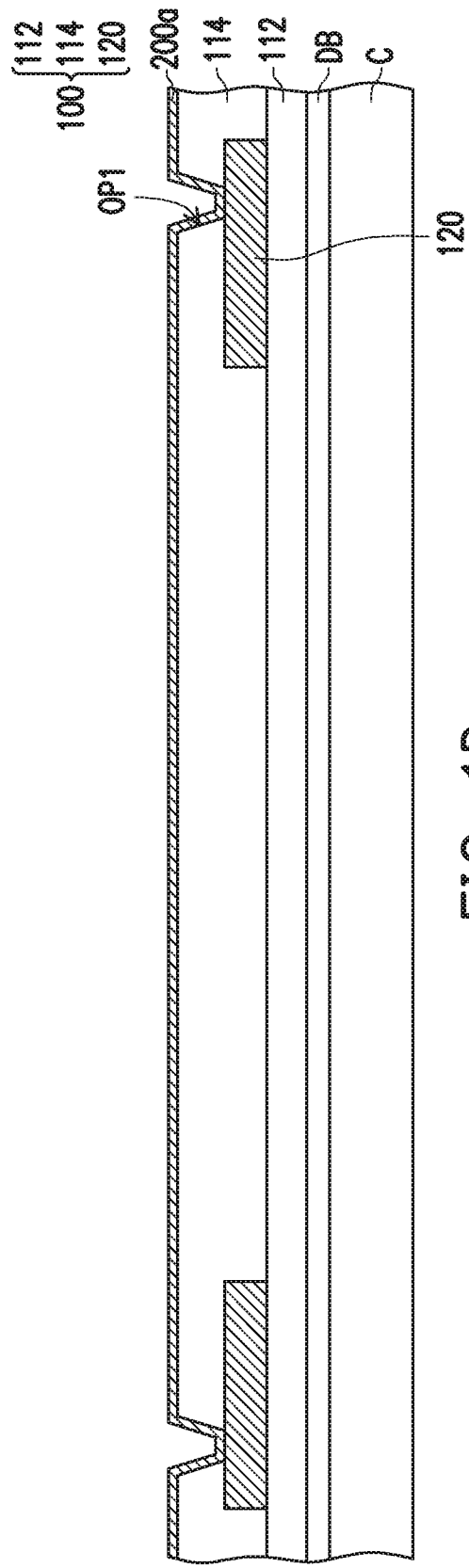
Figure 1E:
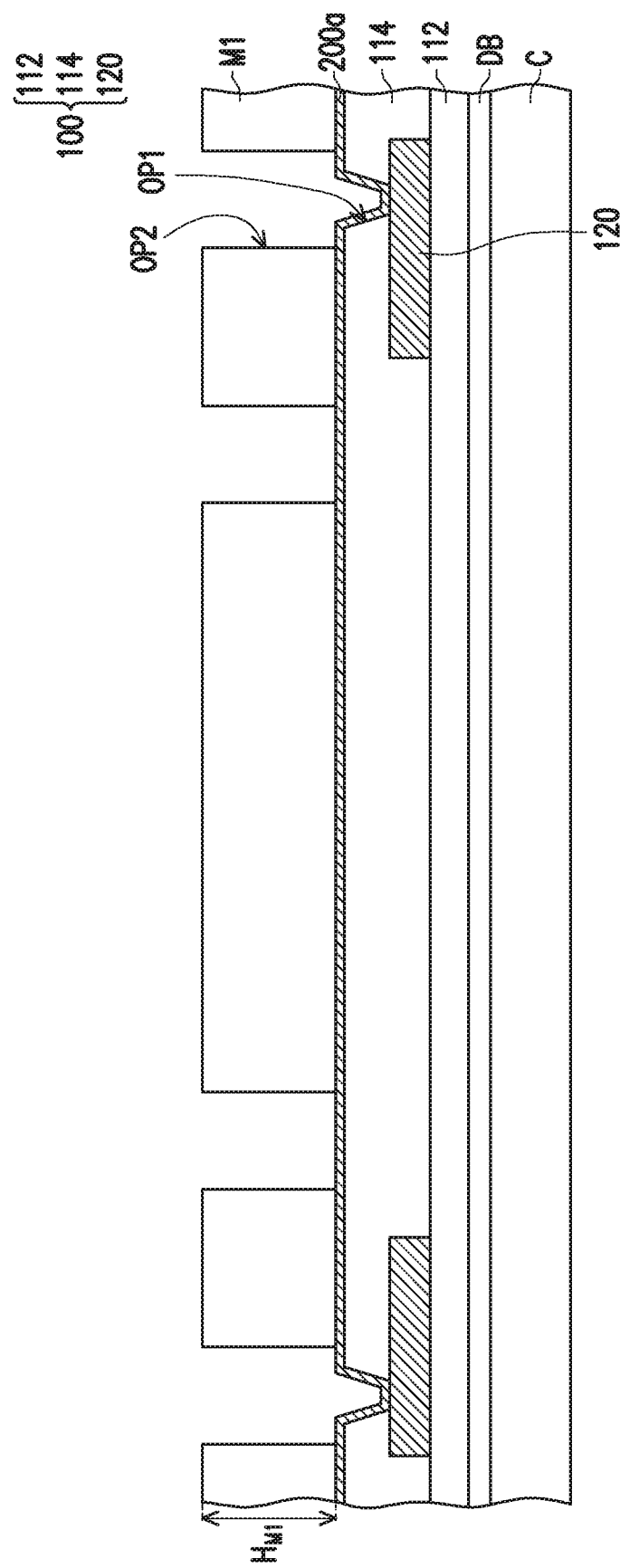
Figure 1F:
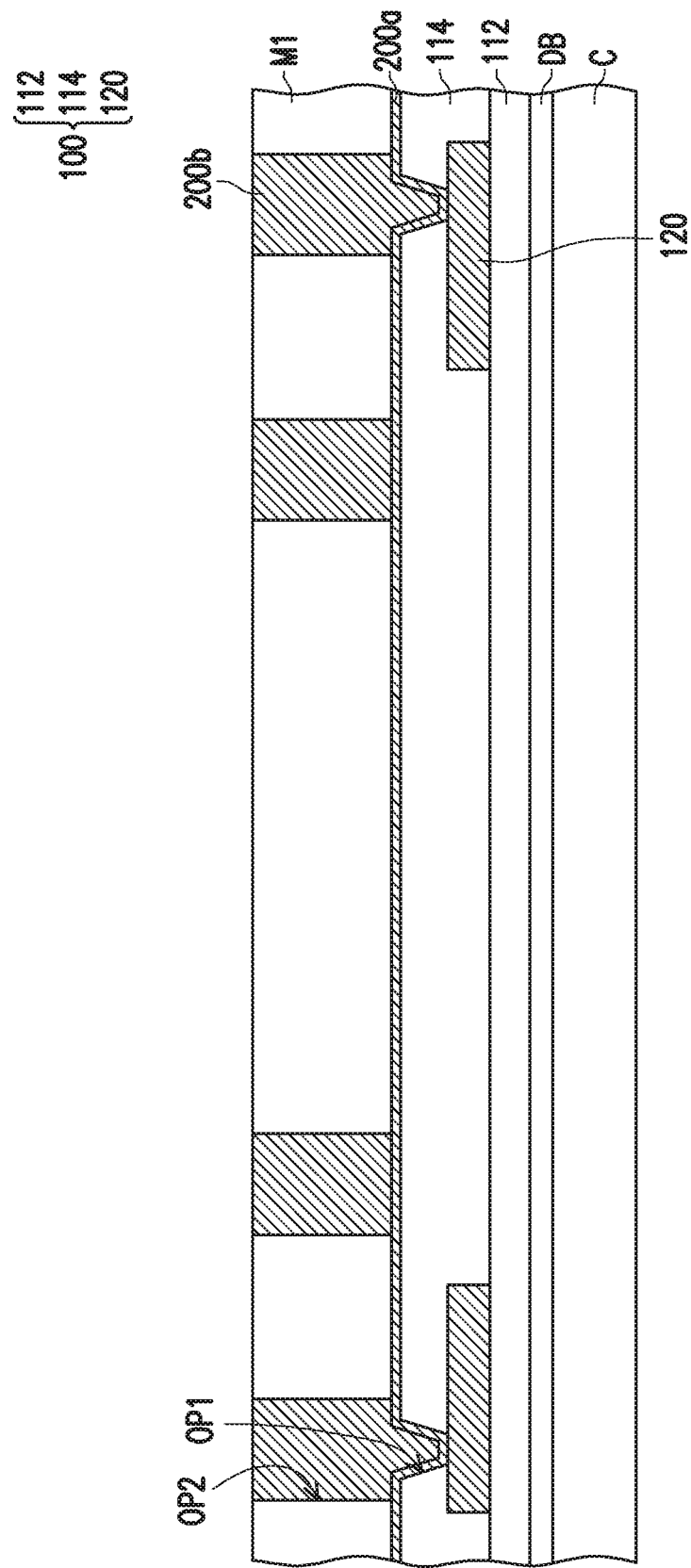
Figure 1G:
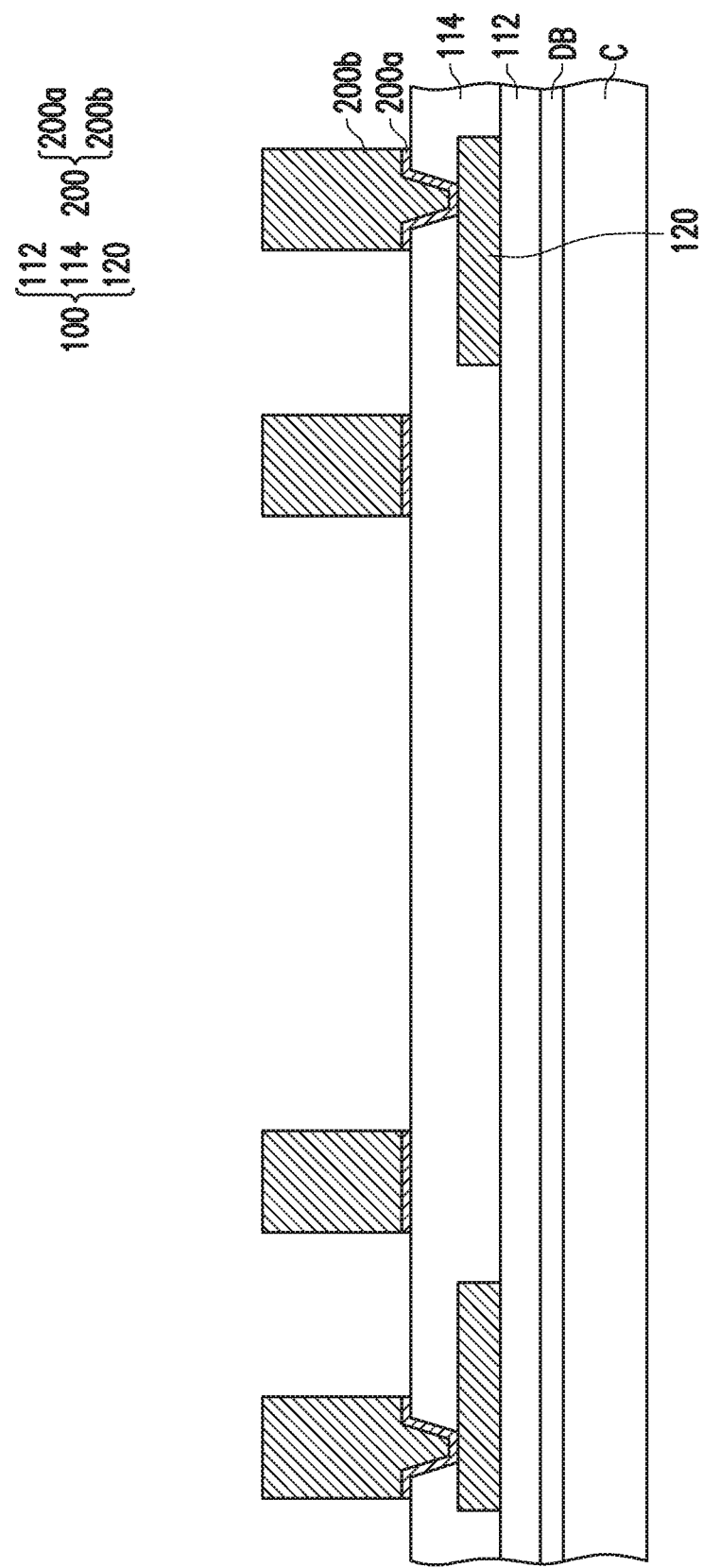
Figure 1H:
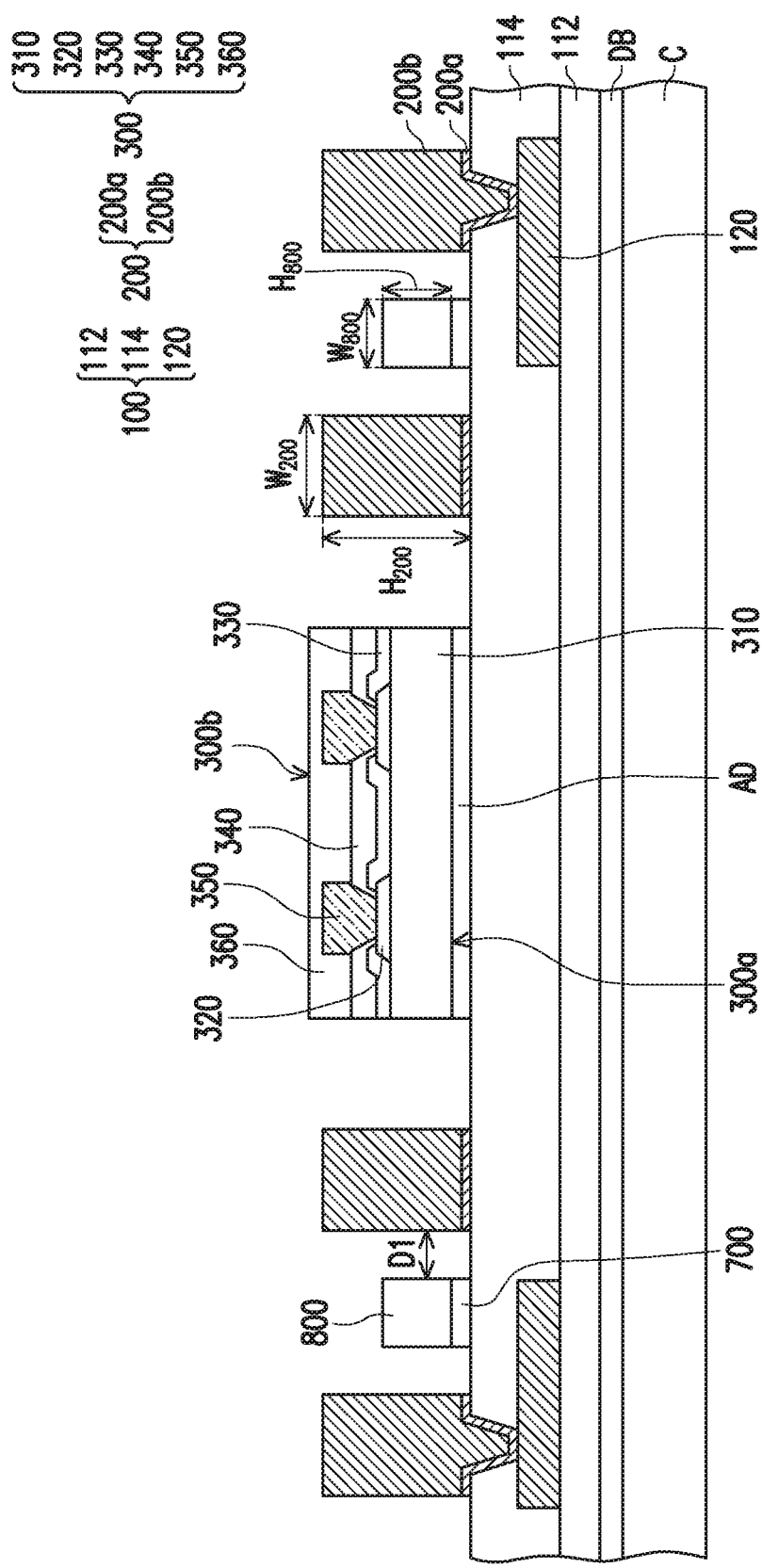
Figure 1:
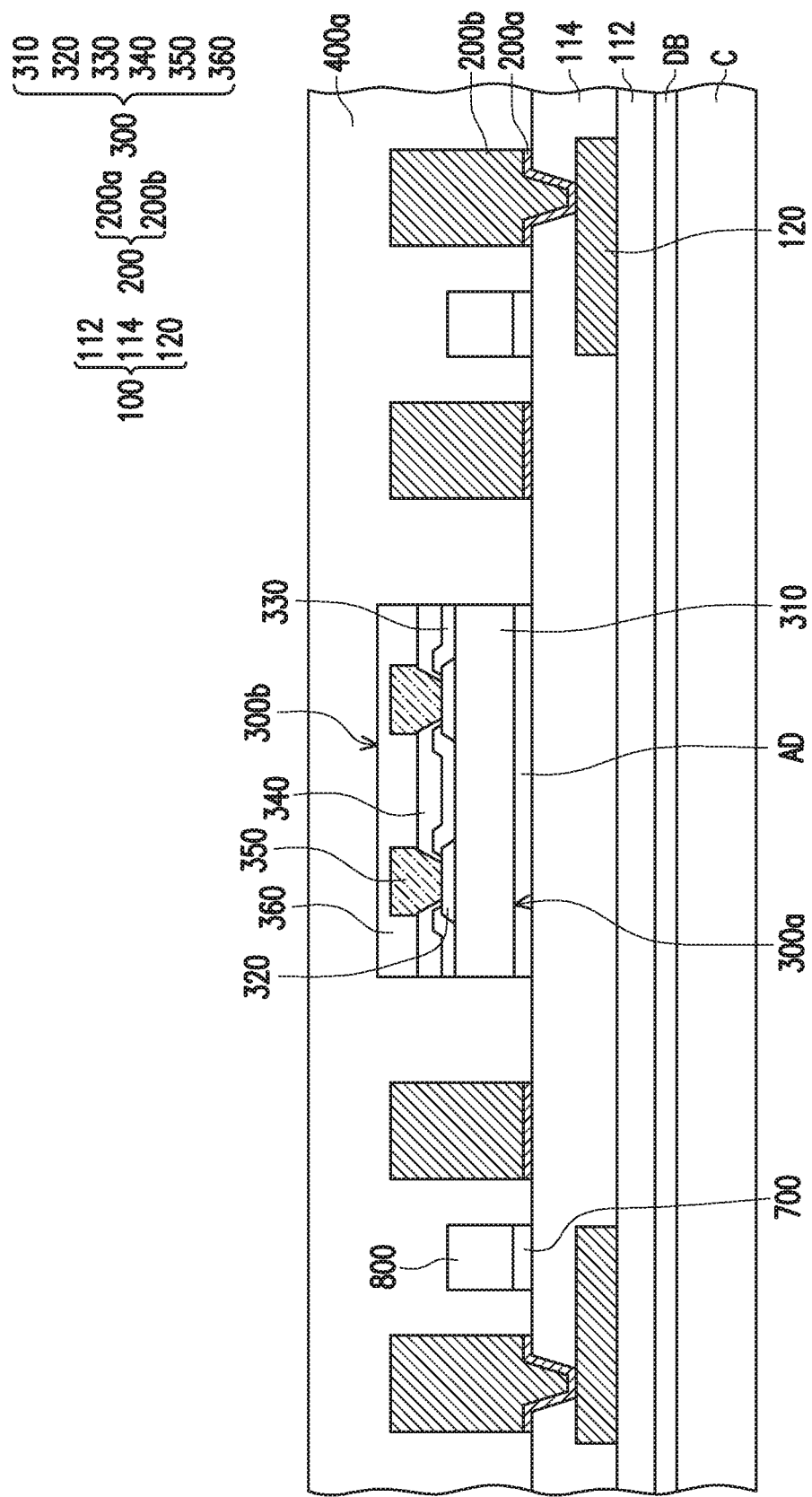
Figure 1J:
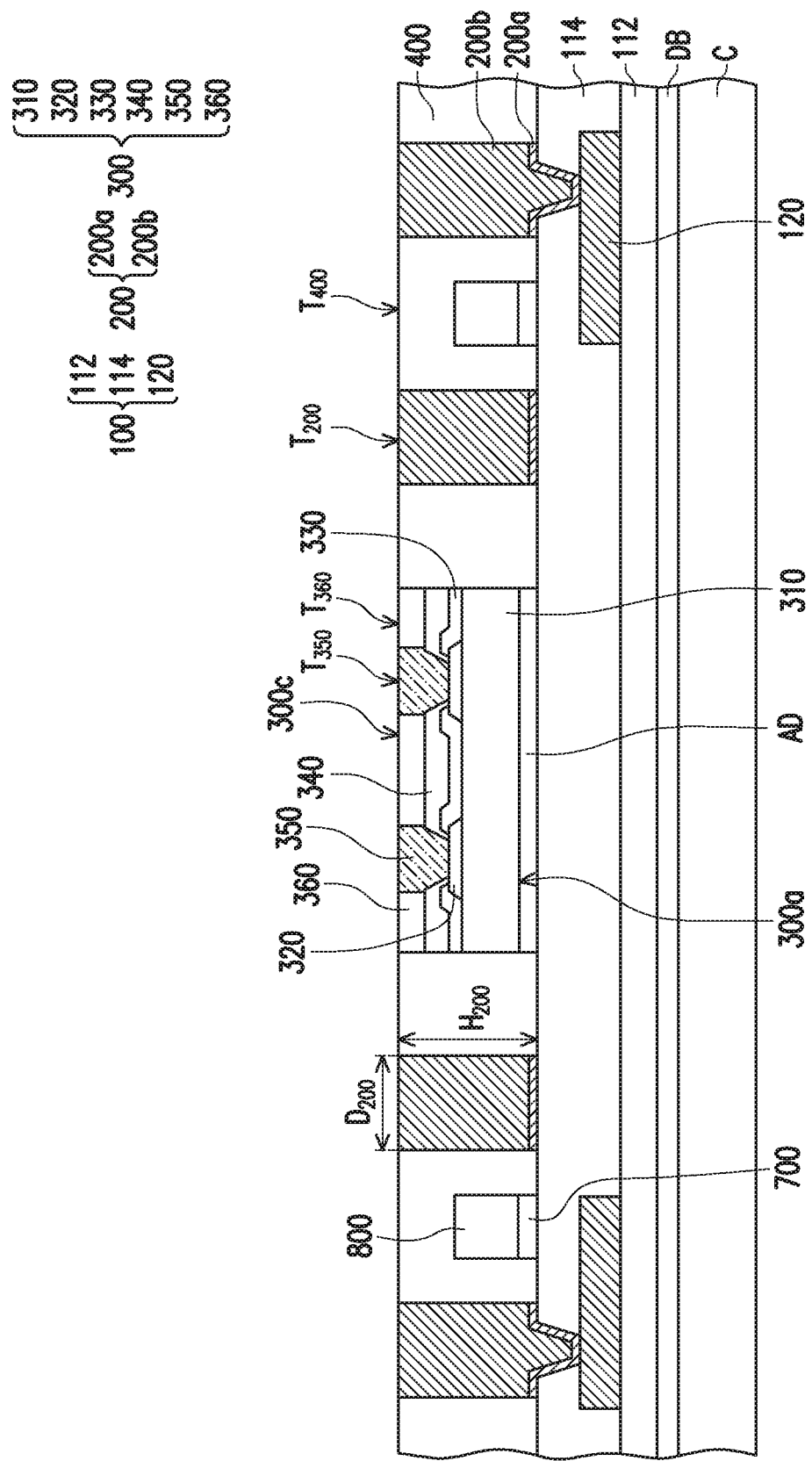
Figure 1K:
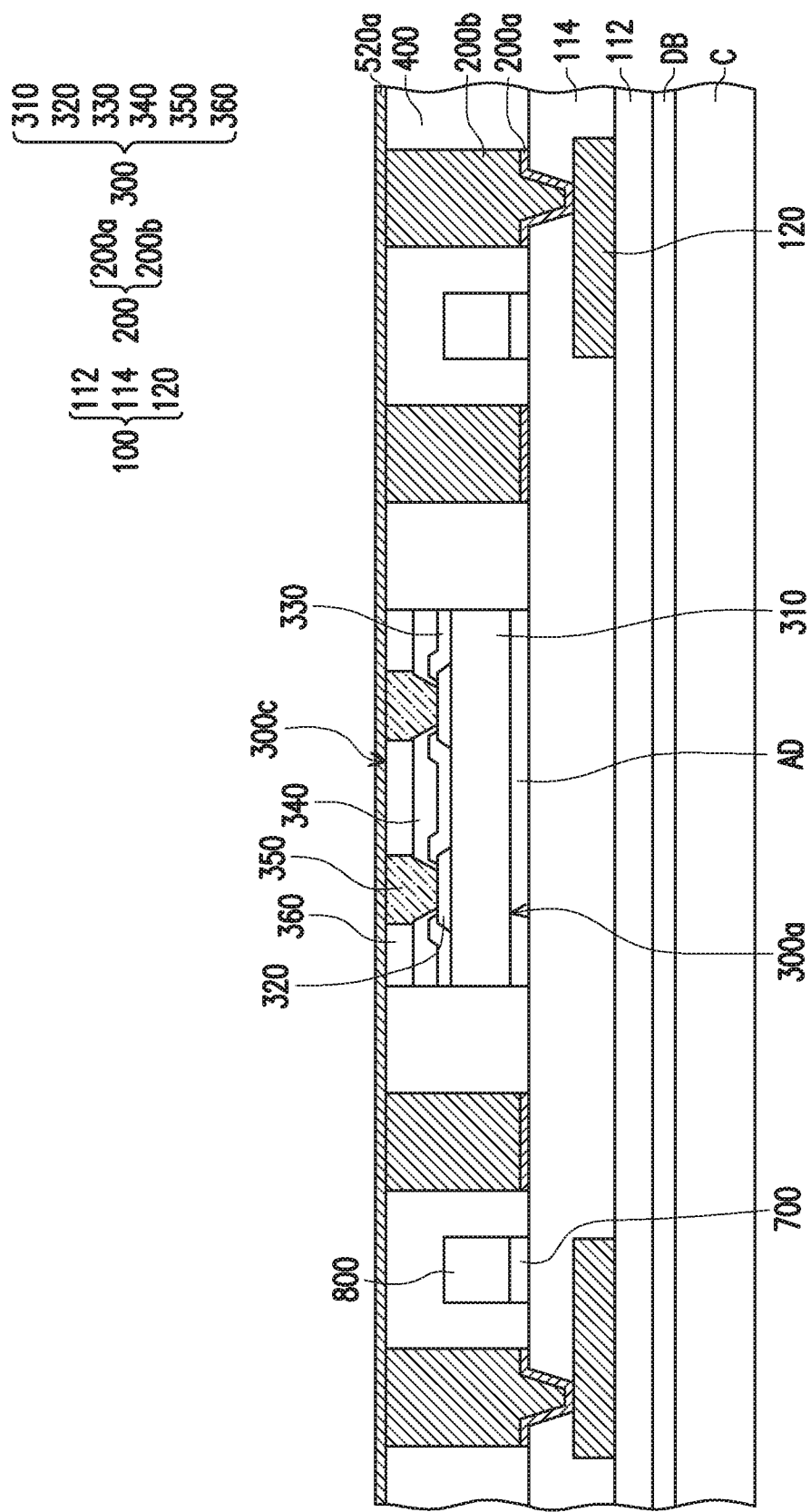
Figure 1L:
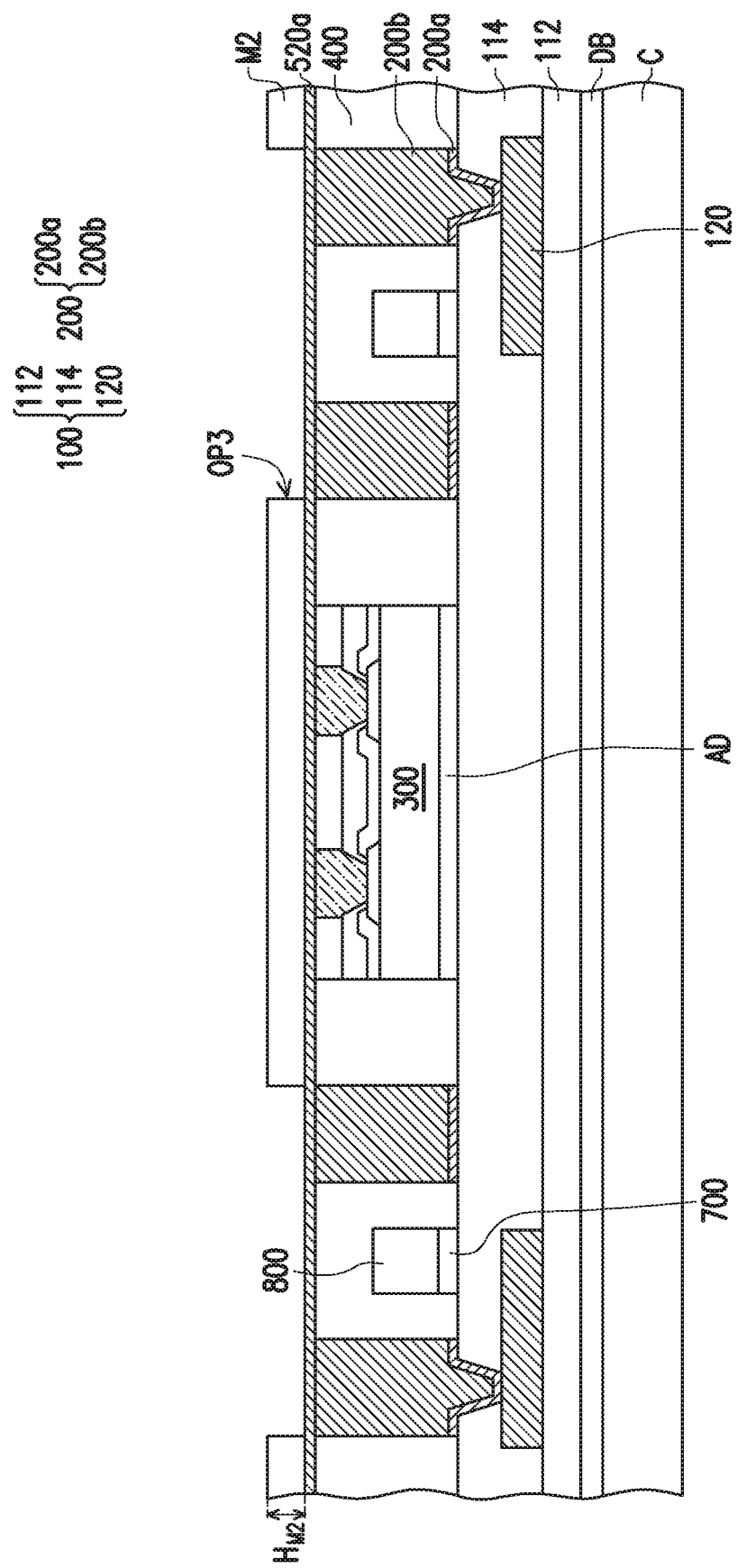
Figure 1M:
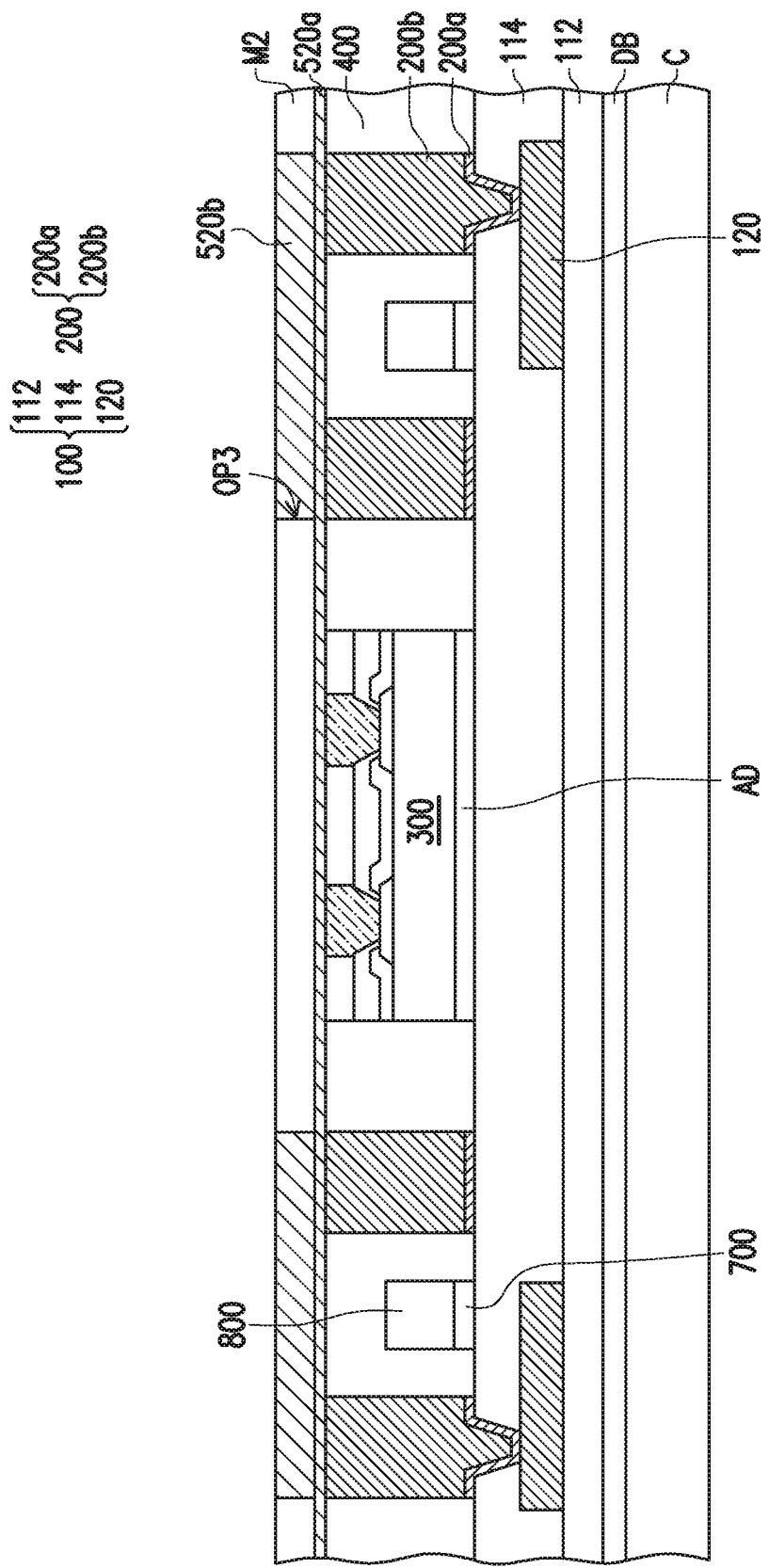
Figure 1N:
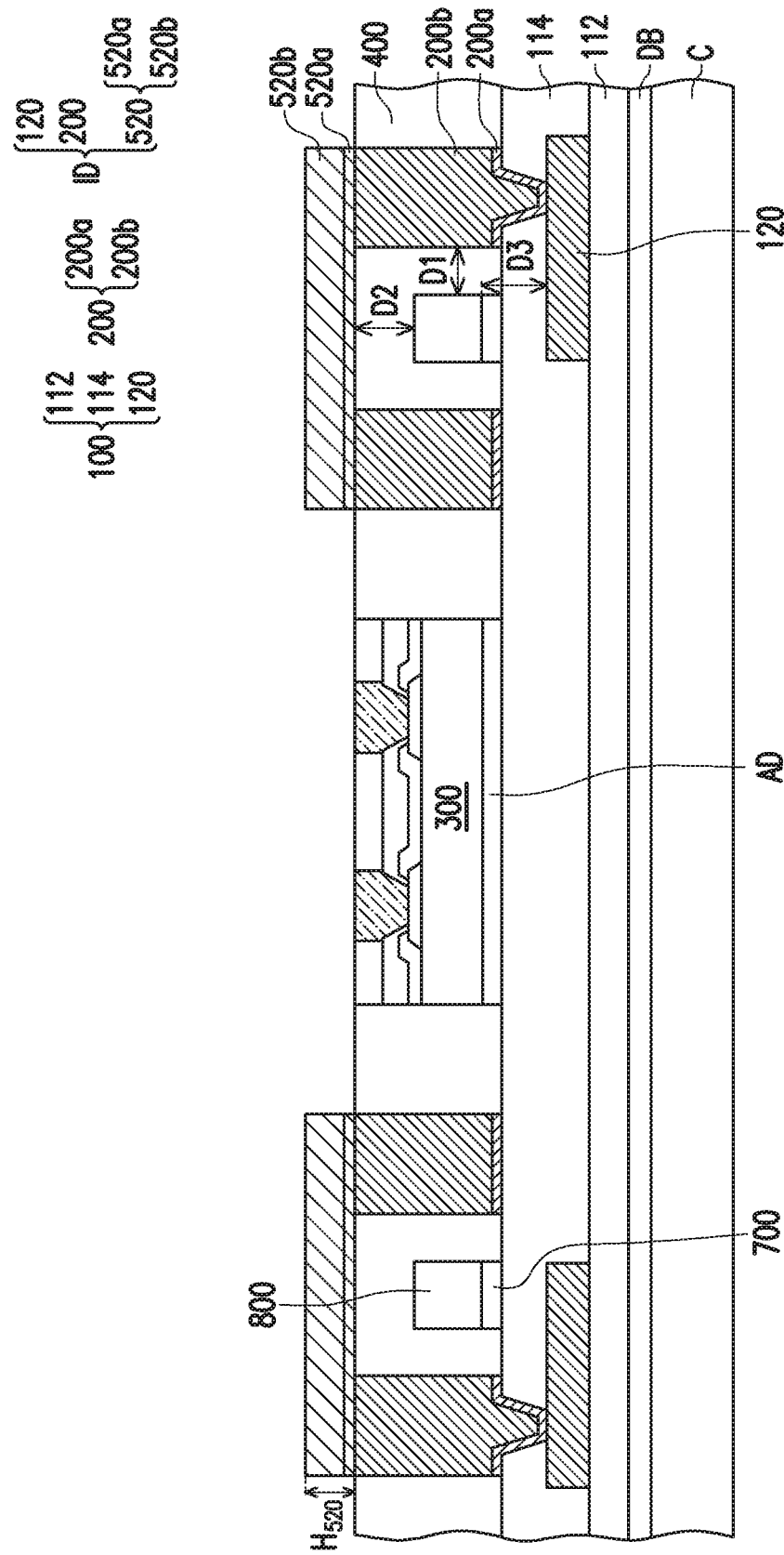
Figure 10:
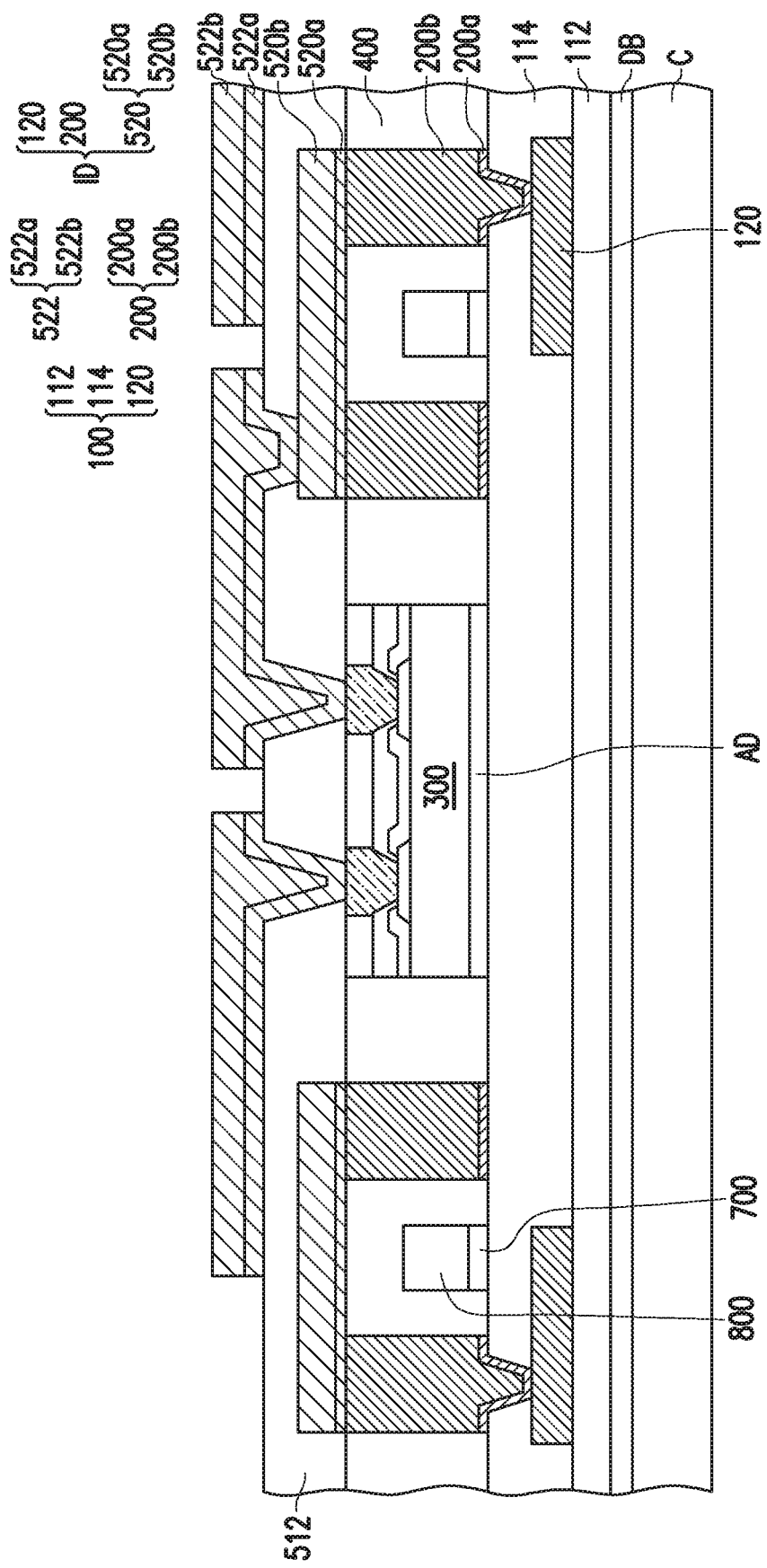
Figure 1P:
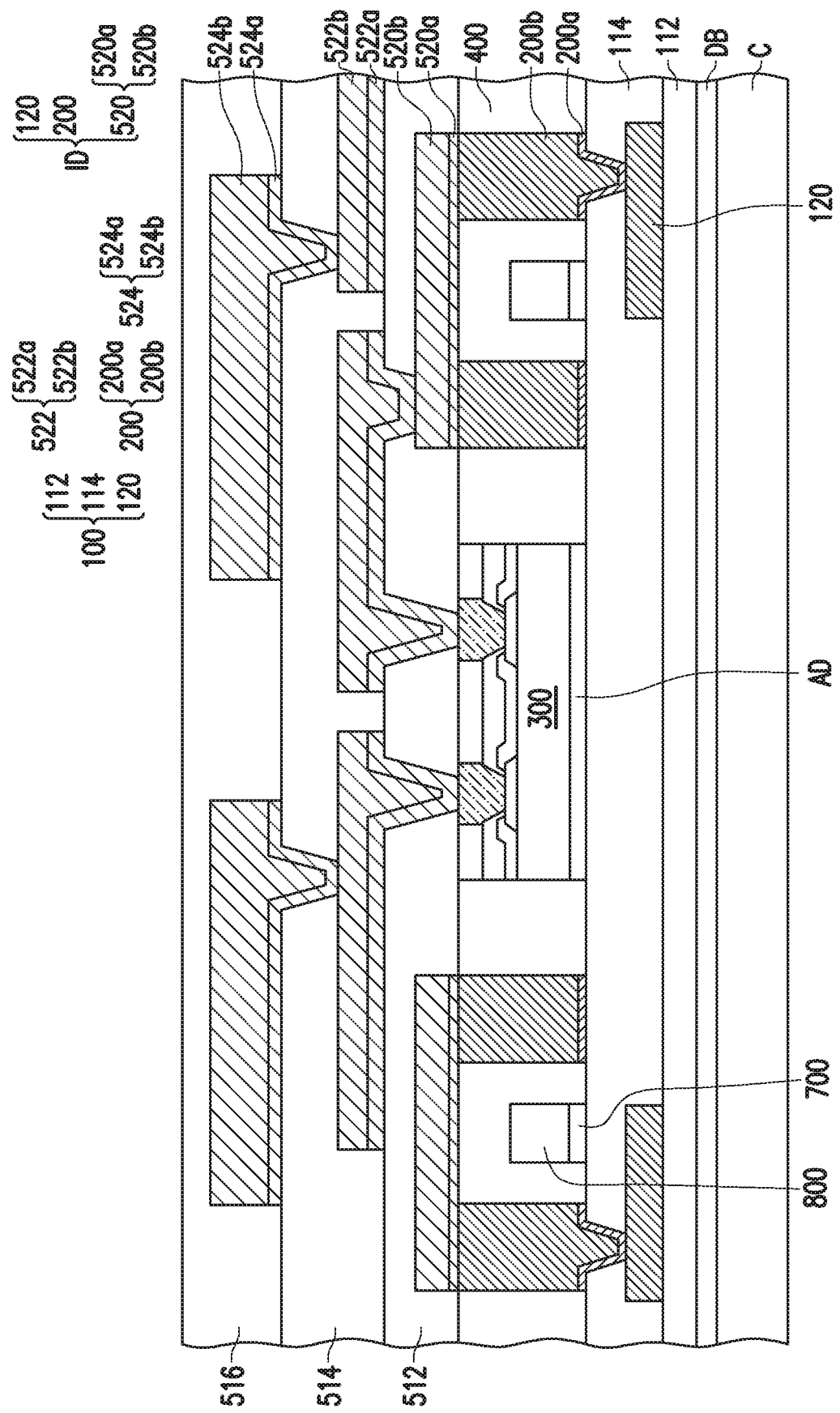
Figure 1Q:
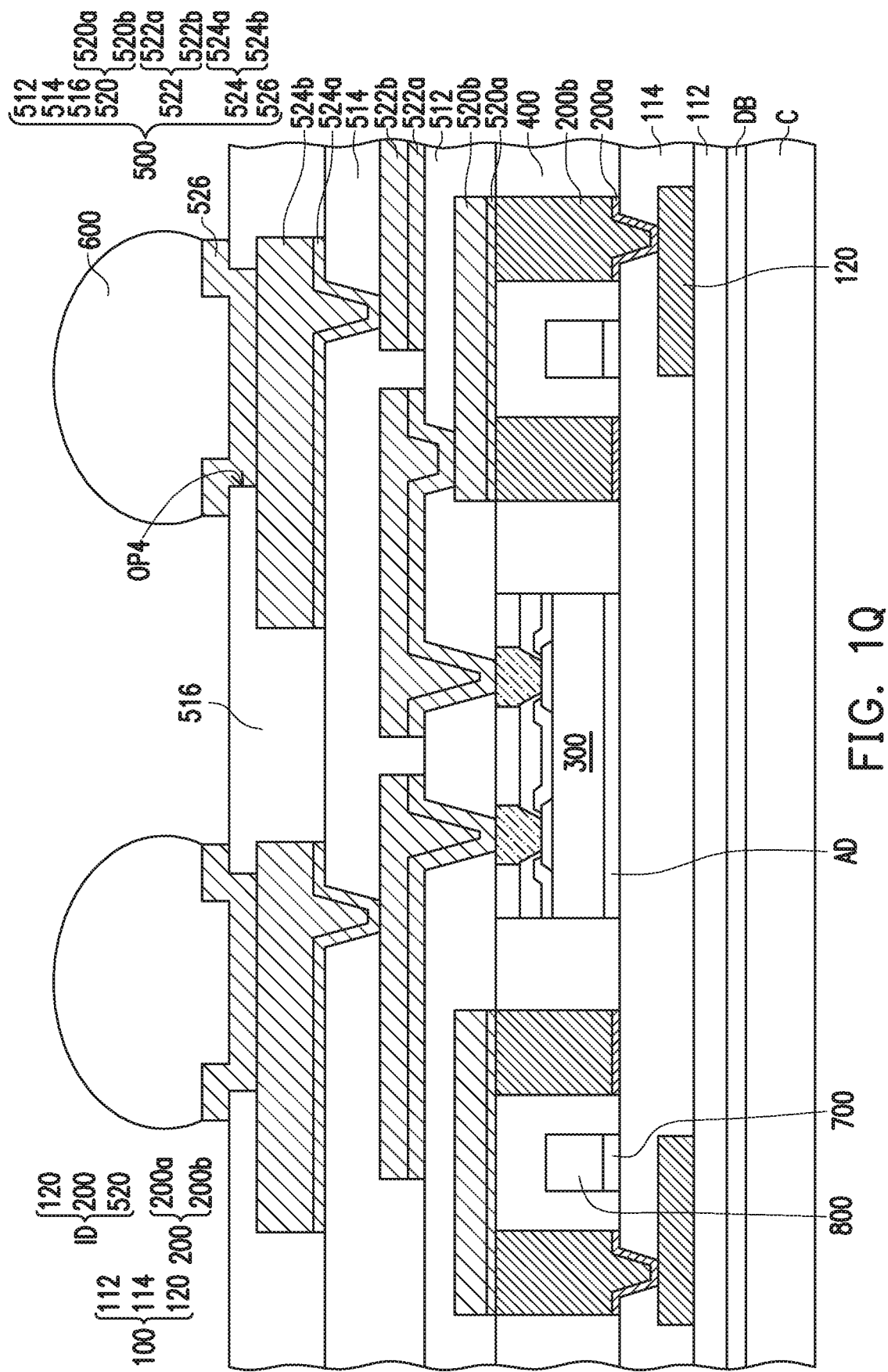
Figure 1R:
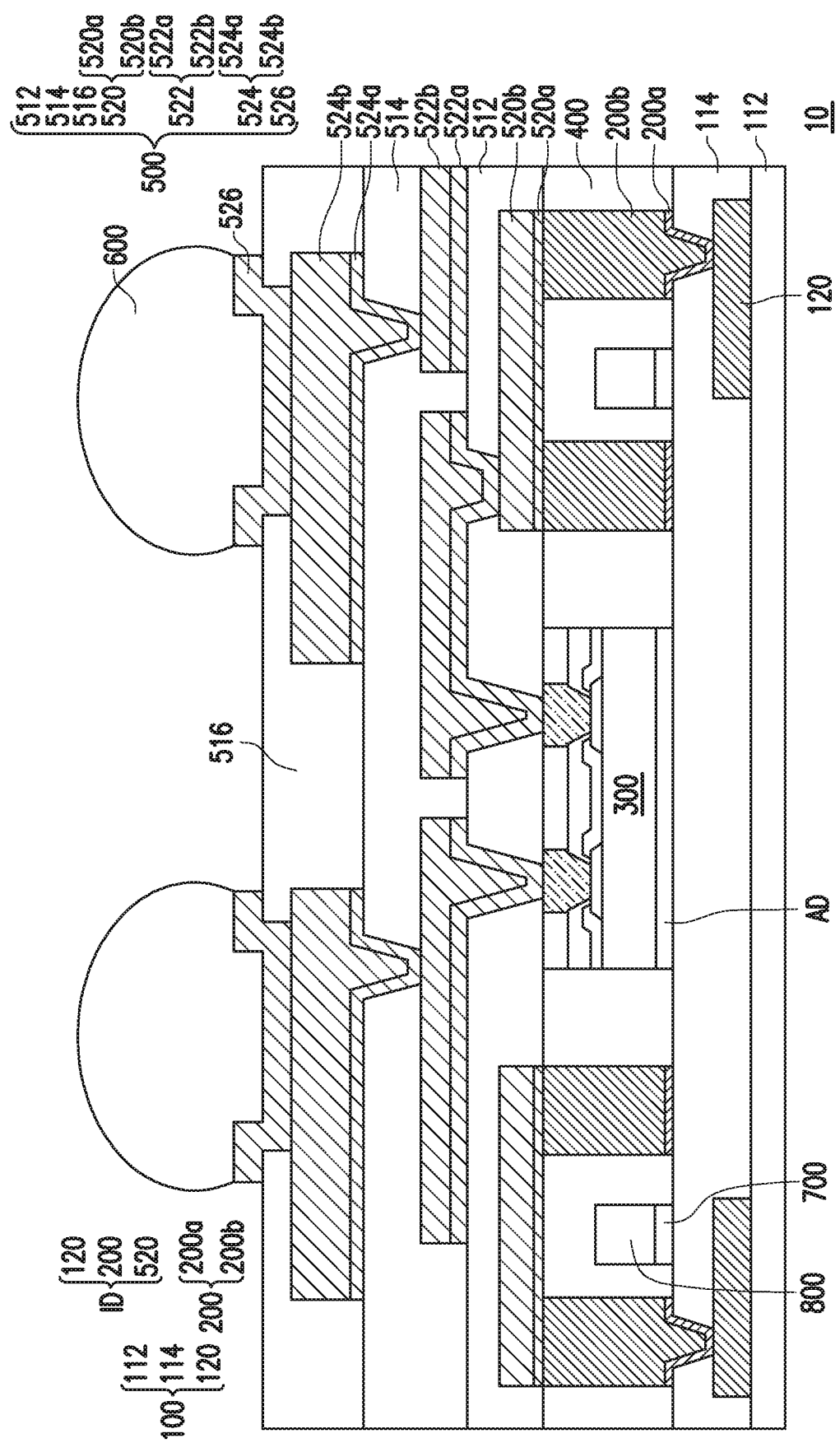

FIGS. 1A to 1R are schematic cross-sectional views illustrating the method M10 in accordance with some embodiments of the disclosure. Referring to FIG. 1A, a substrate C having a de-bonding layer DB formed thereon is provided. In some embodiments, the de-bonding layer DB is formed on a top surface of the substrate C. In some embodiments, the substrate C may be a glass substrate and the de-bonding layer DB may be a light-to-heat conversion (LTHC) release layer formed on the glass substrate. However, the disclosure is not limited thereto. In some alternative embodiments, other suitable materials may be adapted for the substrate C and the de-bonding layer DB.

As illustrated in FIG. 1A, a dielectric layer 112 is formed on the de-bonding layer DB. In some embodiments, the dielectric layer 112 may be formed by suitable fabrication techniques such as spin-on coating, chemical vapor deposition (CVD), plasma-enhanced chemical vapor deposition (PECVD), or the like. In some embodiments, the dielectric layer 112 can be a single or multiple layers stacking over each other. In some embodiments, the dielectric layer 112 includes polymeric material. The polymeric material may include low temperature polyimide (LTPI), epoxy resin, acrylic resin, phenol resin, benzocyclobutene (BCB), polybenzooxazole (PBO), or any other suitable polymer-based dielectric material. In some embodiments, the polymeric material is dissolved in a solvent to enhance the coating fluidity. In some embodiments, after the polymeric material is uniformly coated on the de-bonding layer DB, a curing process is performed to evaporate the solvent. For example, the dielectric layer 112 may be cured through a soft-baking process.

As illustrated in FIG. 1A, a plurality of conductive patterns 120 are formed on the dielectric layer 112. In some embodiments, a material of the conductive patterns 120 includes aluminum, titanium, copper, nickel, tungsten, and/or alloys thereof. The conductive patterns 120 may be formed by, for example, electroplating, deposition, and/or photolithography and etching. The conductive patterns 120 may be formed by the following process. First, a seed layer (not shown) is blanketly formed over the dielectric layer 112. In some embodiments, the seed layer includes a titanium/copper composite layer and is formed by a sputtering process. Then, a mask pattern (not shown) having openings is formed on the seed layer. The openings of the mask pattern expose the intended location for the subsequently-formed conductive patterns 120. Afterwards, a plating process is performed to form a conductive material layer on the seed layer exposed by the openings of the mask pattern. In some embodiments, a material of the conductive material layer includes aluminum, titanium, copper, nickel, tungsten, and/or alloys thereof. The mask pattern and the underlying seed layer are then removed by a stripping process and an etching process. The remaining seed layer and the remaining conductive material layer then constitute the conductive patterns 120.

A top view of the conductive patterns 120 in accordance with some embodiments is shown in FIG. 2. In some embodiments, each conductive pattern 120 is formed to have a height $H_{120}$ between about 2 μm and about 50 μm and a width $W_{120}$ between about 2 and about 50 μm, wherein the width $W_{120}$ is measured along a direction substantially perpendicular to a longitudinal direction of the conductive pattern 120. In some embodiments, a spacing $D_{120}$ between adjacent conductive patterns 120 depends on different applications and specifications. In some embodiments, adjacent conductive patterns 120 may have a minimum of the spacing $D_{120}$ between about 2 μm and about 50 therebetween to avoid short circuiting.

Referring to FIG. 1B, a dielectric layer 114 is formed on the dielectric layer 112 to cover the conductive patterns 120. In other words, the conductive patterns 120 are sandwiched between the dielectric layer 112 and the dielectric layer 114. In some embodiments, a material and a formation method of the dielectric layer 114 may be similar to those of the dielectric layer 112. However, the disclosure is not limited thereto. In some alternative embodiments, the material and the formation method of the dielectric layer 114 may be different from those of the dielectric layer 112. In some embodiments, the dielectric layer 114 may be formed by suitable fabrication techniques, such as spin-on coating, CVD, PECVD, or the like. In some embodiments, the dielectric layer 114 includes polymeric material. The polymeric material may include LTPI, epoxy resin, acrylic resin, phenol resin, BCB, PBO, or any other suitable polymer-based dielectric material. In some embodiments, the polymeric material is dissolved in a solvent to enhance the coating fluidity. In some embodiments, after the polymeric material is uniformly coated on the dielectric layer 112 and the conductive patterns 120, a curing process is performed to evaporate the solvent. For example, the dielectric layer 114 may be cured through a soft-baking process. In some embodiments, the dielectric layer 114 has a permittivity (Dk) between about 2.5 and about 3.1 and a dissipation factor (DO between about 0.005 and about 0.01.

In some embodiments, the dielectric layer 112, the dielectric layer 114 and the conductive patterns 120 are collectively referred to as a first redistribution structure 100. In some embodiments, the first redistribution structure 100 may include several dielectric layers and several layers of conductive patterns. In some embodiments, the conductive patterns 120 shown in FIG. 2 are at a same elevation and merely one of multiple layers of conductive patterns of the first redistribution structure 100. In some embodiments, the conductive patterns 120 are configured to provide an electrical path and may also be referred to as conductive lines, metal patterns or metal lines. In some embodiments, the first redistribution structure 100 may be referred to as a back-side redistribution structure. It should be noted that the number of the conductive patterns and the number of the dielectric layers illustrated in FIG. 1B and FIG. 2 are merely for illustrative purposes, and the disclosure is not limited thereto. In some alternative embodiments, more layers of conductive patterns and more layers of dielectric layers may be formed depending on the circuit design. When more layers of conductive patterns and more layers of dielectric layers are adapted, these conductive patterns and these dielectric layers are stacked alternately, and the conductive patterns may be interconnected with one another through a plurality of conductive vias (not shown).

Referring to FIG. 1C, a plurality of contact openings OP1 are formed in the dielectric layer 114 to expose at least a portion of each conductive pattern 120. In some embodiments, the contact openings OP1 may be formed by a photolithography process and an etching process.

Referring to FIG. 1D, a seed layer 200a is blanketedly and conformally formed over the dielectric layer 114. In some embodiments, the seed layer 200a extends into the contact openings OP1 to be directly in contact with the conductive patterns 120. In some embodiments, the seed layer 200a is a composite layer formed by different materials. For example, the seed layer 200a may be constituted by two sub-layers (not shown). The first sub-layer may include titanium, titanium nitride, tantalum, tantalum nitride, other suitable materials, or a combination thereof. The second sub-layer may include copper, copper alloy, or another suitable material. In some embodiments, the seed layer 220a is formed by physical vapor deposition (PVD), sputtering, or another applicable method.

Referring to FIG. 1E, a mask pattern M1 is formed on the seed layer 200a. The mask pattern M1 has openings OP2 partially exposing the seed layer 200a. In some embodiments, portions of the seed layer 200a inside the contact openings OP1 of the dielectric layer 114 are exposed. In some embodiments, the openings OP2 of the mask pattern M1 also expose portions of the seed layer 200a proximal to the contact openings OP1. In some embodiments, the mask pattern M1 may be formed by a photosensitive material. For example, the mask pattern M1 may be a photoresist or a dry film. In some embodiments, the mask pattern M1 is formed to have a height $H_{M1}$ between about 100 and about 500 μm.

Referring to FIG. 1F, a conductive material layer 200b is deposited into the openings OP2 of the mask pattern M1. In some embodiments, the conductive material layer 200b is formed on the portion of the seed layer 200a exposed by the openings OP2 of the mask pattern M1. In some embodiments, since the conductive material layer 200b fills the openings OP2 of the mask pattern M1, the conductive material layer 200b and the openings OP2 of the mask pattern M1 may have the same contour. In some embodiments, a profile of a lower portion of the conductive material layer 200b in the opening OP2 is conformal to a profile of the seed layer 200a. In some embodiments, the conductive material layer 200b may be formed by a plating process followed by a grinding process. In some embodiments, the plating process is, for example, electroplating, electroless plating, immersion plating, or the like. The grinding process includes, for example, a mechanical grinding process, a chemical mechanical polishing (CMP) process, or the like. However, the disclosure is not limited thereto. In some alternative embodiments, the grinding process may be omitted. The conductive material layer 200b includes, for example, copper, copper alloys, or the like.

Referring to FIG. 1G, the mask pattern M1 is removed. In some embodiments, the mask pattern M1 may be removed through a stripping process, an etching process, and/or a cleaning process. For example, the mask pattern M1 may be removed through applying chemicals such as dimethylsufoxide (DMSO), water ($H_2O$), and tetramethyl ammonium hydroxide (TMAH). In some embodiments, the TMAH compounds are able to break the cross-linkage of molecules within the mask pattern M1. The DMSO compounds are able to dissolve the molecules within the mask pattern M1. Upon removal of the mask pattern M1, a portion of the seed layer 200a is exposed from the conductive material layer 200b. Subsequently, the exposed portion of the seed layer 200a is removed through an etching process. In some embodiments, the etching process may include an anisotropic etching process such as a dry etch or an isotropic etching process such as a wet etch. In some embodiments, an etchant for the wet etch includes a combination of hydrogen fluoride (HF), copper (Cu), and ammonia ($NH_3$), a combination of HF and TMAH, or the like.

In some embodiments, the conductive material layer 200b and the remaining seed layer 200a may be collectively referred to as through insulating vias (TIV) 200. The TIVs 200 are formed on the first redistribution structure 100. In some embodiments, the TIVs 200 are electrically connected to the conductive patterns 120 of the first redistribution structure 100. It should be noted that the number of the TIVs 200 shown in FIG. 1G merely serves as an exemplary illustration, and the number of the TIVs 200 may be varied based on demand.

Referring to FIG. 1H, one or more dies 300 are disposed on the first redistribution structure 100. For simplicity and a purpose of illustration, only one die 300 is shown in FIG. 1H; however, the die 300 shown in the figures can represent one or a plurality of dies 300. In some embodiments, the TIVs 200 are disposed at one or more sides of the die 300. In some embodiments, the die 300 is disposed between the TIVs 200 from a cross-sectional view as shown in FIG. 1H such that the TIVs 200 are disposed on two opposite sides of the die 300. In some embodiments, the die 300 is attached to the first redistribution structure 100 by a pick-and-place method. For example, the one or more dies 300 are attached to a substrate (not shown). The substrate is then flipped over to attach the one or more dies 300 to the first redistribution structure 100 (e.g., by a wafer-to-wafer bonding process). An in-situ annealing is performed, for example, in a same bonding chamber as that used for a wafer-to-wafer bonding process. The substrate is then debonded from the one or more dies 300, for instance, by mechanical peeling. Another annealing is optionally performed.

Each die 300, for example, includes a semiconductor substrate 310, a plurality of conductive pads 320, a passivation layer 330, a post-passivation layer 340, a plurality of vias 350, and a protection layer 360. In some embodiments, the conductive pads 320 are disposed over the semiconductor substrate 310. The passivation layer 330 is formed over the semiconductor substrate 310 and has contact openings that partially expose the conductive pads 320. The semiconductor substrate 310 may be a silicon substrate including active components (e.g., transistors or the like) and passive components (e.g., resistors, capacitors, inductors, or the like) formed therein. The conductive pads 320 may be aluminum pads, copper pads, or other suitable metal pads. The passivation layer 330 may be a silicon oxide layer, a silicon nitride layer, a silicon oxy-nitride layer, or a dielectric layer formed by other suitable dielectric materials. Furthermore, the post-passivation layer 340 is formed over the passivation layer 330. The post-passivation layer 340 covers the passivation layer 330 and has a plurality of contact openings. The conductive pads 320 are partially exposed from the contact openings of the post-passivation layer 340 for filling the vias 350. The post-passivation layer 340 may be a polyimide layer, a PBO layer, or a dielectric layer formed by other suitable polymers. In some embodiments, the post-passivation layer 340 may be optional. In addition, the vias 350 are formed on the conductive pads 320 and in the openings of the post-passivation layer 340. In some embodiments, the vias 350 are made of conductive materials and are plated on the conductive pads 320. For example, a material of vias 350 may include copper, copper alloys, or the like. The protection layer 360 is formed on the post-passivation layer 340 to cover the vias 350.

The die 300 has a rear surface 300a and a front surface 300b opposite to the rear surface 300a. In some embodiments, the rear surface 300a of the die 300 is attached (or adhered) to the first redistribution structure 100 through an adhesive layer AD. In some embodiments, the adhesive layer AD may include a die attach film (DAF) or another material having adhesion property. The front surface 300b of the die 300 faces upward. As illustrated in FIG. 1H, a front top surface 300b opposite to the rear surface 300a of the die 300 is located at a level higher than top surfaces of the TIVs 200. However, the disclosure is not limited thereto. In some alternative embodiments, the front surface 300b of the die 300 may be substantially coplanar with the top surfaces of the TIVs 200 or may be located at a level lower than the top surfaces of the TIVs 200.

As illustrated in FIG. 1H, a permalloy structure is formed on the first redistribution structure 100. The permalloy structure one or more members isolated from each other. Each of the members is referred to as a permalloy core 800. In other words, one or more permalloy cores 800 are also formed on the first redistribution structure 100, and each of the permalloy cores 800 is surrounded by TIVs 200 and sandwiched between the conductive patterns 120 and the conductive patterns 520. In some embodiments, the permalloy cores 800 are elongated laterally over the first redistribution structure 100. In some embodiments as shown in FIG. 1H, the permalloy cores 800 are elongated parallel to each other. In some embodiments, the permalloy cores 800 are attached to the first redistribution structure 100 by a pick-and-place method, similar to the pick-and-place method for attaching the die 300 to the first redistribution structure 100. In some embodiments, a distance D1 between the permalloy core 800 and an adjacent TIV 200 along the lateral direction may be between about 5 µm and about 50 µm. In the embodiments shown in FIG. 1H, the permalloy cores 800 are disposed on two opposite sides of the die 300. In some embodiments, the permalloy cores 800 may be disposed on only one side of the die 300. In some embodiments, the permalloy cores 800 may be disposed on two or more adjacent sides of the die 300.

In some embodiments, the term "permalloy" may be replaced by "Mo-permalloy," "Mumetal," "Ultraperm," or "Super-malloy." In some embodiments, each of the permalloy cores 800 has high magnetic permeability and low coercive force and hysteresis. For example, in some embodiments, a magnetic permeability ($\mu_m$) of a permalloy core 800 is between about 100 and about 1,000,000. In some embodiments, the permalloy core 800 includes Ni, Fe, Co, Mo, Si, Nb, B, or a combination thereof. For example, the permalloy core 800 may be an alloy formed by at least two of these elements. However, the disclosure is not limited thereto. In some alternative embodiments, the permalloy core 800 may be an alloy formed by at least one of the materials listed above and other materials not listed. In some embodiments, the permalloy core 800 is attached (or adhered) to the first redistribution structure 100 through an adhesive layer 700. The adhesive layer 700 may be the same as or different from the adhesive layer AD. For example, the adhesive layer 700 may include a die attach film (DAF) or another material having adhesive properties.

As illustrated in FIG. 1H, a height $H_{800}$ of the permalloy cores 800 is less than a height $H_{200}$ of the TIVs 200. In some embodiments, the height $H_{200}$ of the TIVs 200 is between about 100 µm and about 500 µm while the height $H_{800}$ of the permalloy cores 800 is between about 10 µm and about 400 µm. In some embodiments, a width $W_{800}$ of the permalloy cores 800 is between about 5 µm and about 50 µm, wherein the width $W_{800}$ is measured along a direction substantially perpendicular to a longitudinal direction of the permalloy core (shown in FIG. 3). In some embodiments, a width (or a diameter) $W_{200}$ of the TIVs 200 may be greater than or equal to the width $W_{800}$ of the permalloy core 800. In some embodiments, the width $W_{200}$ of the TIVs 200 is between about 5 and about 100 µm. In some embodiments, the width $W_{200}$ of the TIVs 200 is between about 5 and about 50 µm. A distance D1 between a permalloy core 800 and the adjacent TIV 200 in the lateral direction may be between about 5 µm and about 50 µm. The configuration of the permalloy cores 800 with respect to the die 300 and the TIVs 200 will be discussed below in conjunction with FIG. 3.

Figure 3:
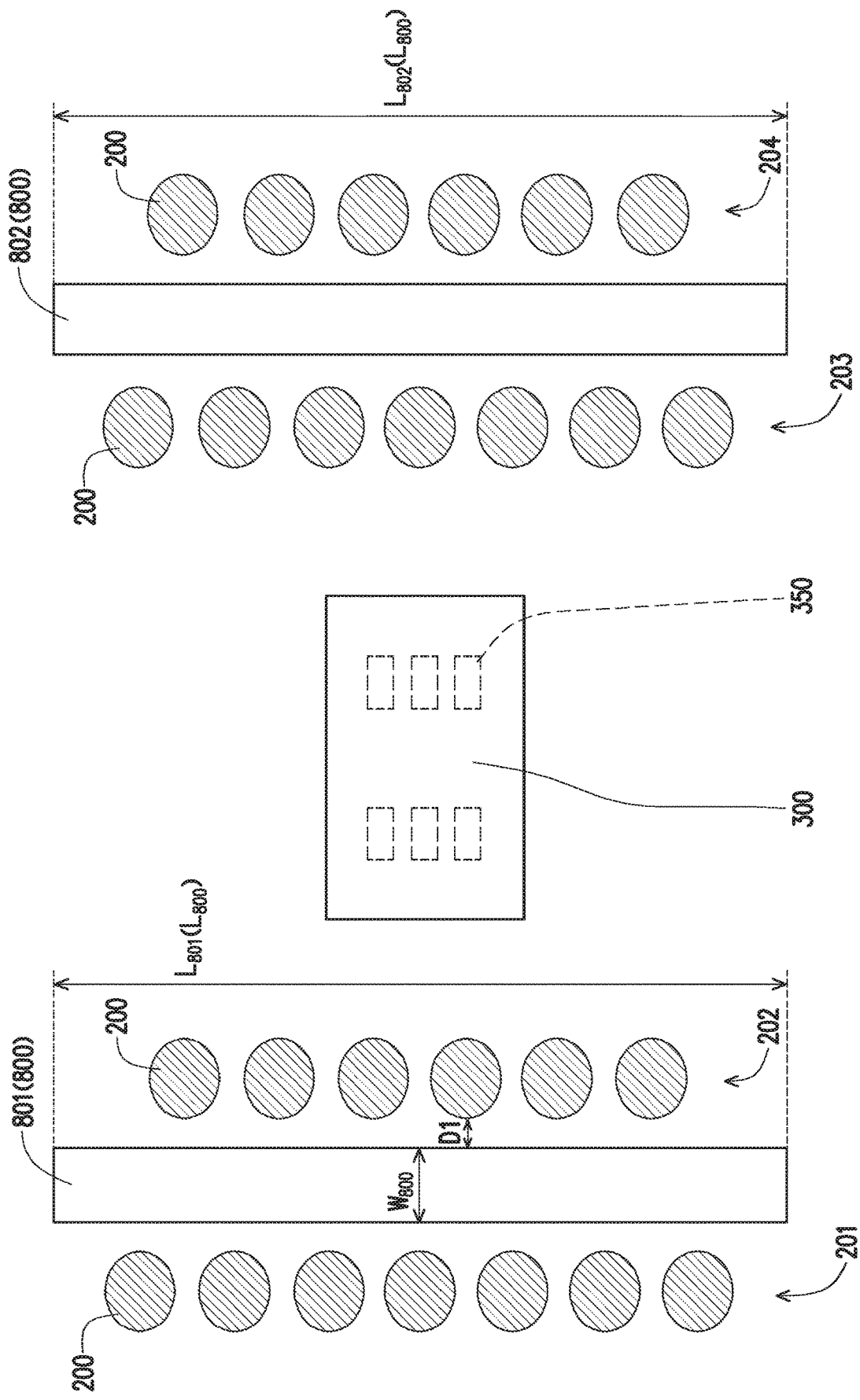
FIG. 3 is a schematic top view of the intermediate structure shown in FIG. 1H.

FIG. 3 is a schematic top view of the manufacture stage of the intermediate structure shown in FIG. 1H. Referring to FIG. 1H and FIG. 3, each of the permalloy cores 800 may be a substantially straight structure. In some embodiments, the permalloy core 800 has a bar-like or a rod-like configuration. In the embodiments shown in FIGS. 1H and 3, the permalloy cores 800 include a first permalloy core 801 and a second permalloy core 802. The two permalloy cores 801 and 802 are separately disposed on two opposite sides of the die 300. In the embodiments of FIG. 3, the first permalloy core 801 and the second permalloy core 802 are substantially parallel. However, in other embodiments, the one or more permalloy cores 800 can extend in different directions. Each of the two permalloy cores 801 and 802 is between two groups (or two lines) of the TIVs 200. As shown in FIG. 3, the first permalloy core 801 is between a first group (or a first line) 201 and a second group (or a second line) 202 of the TIVs 200, and the second permalloy core 802 is between a third group (or a third line) 203 and a fourth group (or a fourth line) 204 of the TIVs 200.

The TIVs 200 in the first group 201 are arranged along a direction parallel to a longitudinal direction of the first permalloy core 801. Similarly, the TIVs 200 in the second group 202 are also arranged along the direction parallel to the longitudinal direction of the first permalloy core 801. The TIVs 200 in the third group 203 are arranged along a direction parallel to a longitudinal direction of the second permalloy core 802. Similarly, the TIVs 200 in the fourth group 204 are also arranged along the direction parallel to the longitudinal direction of the second permalloy core 802. Numbers of the TIVs 200 in different groups 201, 202, 203 and 204 depend on different applications, and are not limited herein.

Each of the TIVs 200 of the first group 201 is offset from each of the TIVs 200 of the second group 202 along a lateral direction substantially perpendicular to the longitudinal direction. In some embodiments, each of the TIVs 200 of the first group 201 is disposed between two adjacent TIVs 200 of the second group 202 along the lateral direction. In some embodiments, a center of each of the TIVs 200 of the first group 201 is aligned with a space between two adjacent TIVs 200 of the second group 202 along the lateral direction. A TIV 200 of the first group 201 may or may not overlap a TIV 200 of the second group 202 along the lateral direction depending on a dimension of the TIV 200 and a distance D between adjacent pairs of TIVs 200 in a same group, and it is not limited herein.

It should be noted that the number of the permalloy cores 800 and the number of the TIVs 200 on two opposite sides of a permalloy core 800 shown in FIG. 3 are for illustrative purposes only. The number of the permalloy cores 800 and the number of the TIVs 200 adjacent to the permalloy core 800 are not limited herein. In addition, a length $L_{800}$ of a permalloy core 800 depends on an inductance per application, and is not limited herein. In the embodiments shown in FIG. 3, a length $L_{801}$ of the permalloy core 801 is substantially equal to a length $L_{802}$ of the permalloy core 802.

Although FIG. 1H illustrates that the die 300 and the permalloy core 800 are placed on the first redistribution structure 100 after the TIVs 200 are formed, the disclosure is not limited thereto. In some alternative embodiments, the die 300 and/or the permalloy core 800 may be placed before the TIVs 200 are formed on the first redistribution structure 100. A sequence of placing the permalloy cores 800 and the die 300 are not limited thereto.

Referring to FIG. 1I, a molding material 400a (or an encapsulating material 400a) is formed over the first redistribution structure 100 to surround or encapsulate the TIVs 200, the permalloy cores 800 and the die 300. For example, the TIVs 200, the permalloy cores 800 and the protection layer 360 of the die 300 are encapsulated by the molding material 400a. In other words, the TIVs 200, the permalloy cores 800 and the protection layer 360 of the dies 300 are not revealed and are well-protected by the molding material 400a. In some embodiments, the molding material 400a is a polymer compound, an underfill material, a resin (such as epoxy), or the like. In some embodiments, the molding material 400a may include fillers. In some embodiments, the molding material 400a has a permittivity (Dk) between about 2.5 and about 3.6 and a dissipation factor (DO between about 0.005 and about 0.02. In some embodiments, the molding material 400a may be formed by a molding process. For example, the molding material 400a may be formed by a compression molding process.

Referring to FIG. 1J, the molding material 400a and the protection layer 360 of the die 300 are ground until top surfaces $T_{350}$ of the vias 350 and top surfaces $T_{200}$ of the TIVs 200 are exposed. After the molding material 400a is ground, a molding layer 400 (or an encapsulant 400) is formed over the first redistribution structure 100 to encapsulate the TIVs 200, the permalloy cores 800 and the die 300. In some embodiments, the molding material 400a is ground by a mechanical grinding process and/or a CMP process. In some embodiments, during the grinding process of the molding material 400a, the protection layer 360 is ground to reveal the vias 350. In some embodiments, portions of the vias 350 and portions of the TIVs 200 are slightly ground as well, and a minimum of the height $H_{200}$ should be slightly less than 100 μm and a maximum of the height $H_{200}$ should be slightly less than 250 μm. After grinding, an active surface 300c of the die 300 is formed and exposed. The exposed portion of the vias 350 is located on the active surfaces 300c of the dies 300. It should be noted that in some embodiments, a height of the portions of the TIVs 200 embedded within the dielectric layer 114 may be negligible.

As illustrated in FIG. 1J, the molding layer 400 covers the permalloy cores 800 and surrounds sidewalls of the die 300 and sidewalls of the TIVs 200. That is, the molding layer 400 encapsulates the permalloy cores 800 and laterally separates the die 300, the permalloy cores 800 and the TIVs 200. The TIVs 200 penetrate the molding layer 400. In other words, the dies 300 and the TIVs 200 are respectively surrounded by the molding layer 400. It should be noted that the top surfaces $T_{200}$ of the TIVs 200, the top surface $T_{360}$ of the protection layer 360, and the top surfaces $T_{350}$ of the vias 350 are substantially coplanar with or at a same elevation as a top surface $T_{400}$ of the molding layer 400.

Referring to FIG. 1K, a seed layer 520a is blanketedly and conformally formed on the active surface 300c of the die 300, the top surfaces $T_{200}$ of the TIVs 200, and the top surface $T_{400}$ of the molding layer 400. For example, the seed layer 520a is directly in contact with the vias 350 of the die 300 and the TIVs 200. In some embodiments, a material and a formation method of the seed layer 520a may be similar to those of the seed layer 220a, so repeated descriptions thereof are omitted herein.

Referring to FIG. 1L, a mask pattern M2 is formed on the seed layer 520a. The mask pattern M2 has openings OP3 partially exposing the seed layer 520a. In some embodiments, portions of the seed layer 520a located directly above the TIVs 200 are exposed. In some embodiments, the mask pattern M2 may be formed with a photosensitive material. For example, the mask pattern M2 may be a photoresist or a dry film. In some embodiments, the mask pattern M2 is formed to have a height $H_{M2}$ between about 2 μm and about 20 μm.

Referring to FIG. 1M, a conductive material layer 520b is deposited in the openings OP3 of the mask pattern M2. In some embodiments, the conductive material layer 520b is formed on the portions of the seed layer 520a exposed by the openings OP3 of the mask pattern M2. In some embodiments, since the conductive material layer 520b fills the openings OP3 of the mask pattern M2, the conductive material layer 520b and the openings OP3 of the mask pattern M2 may have the same contour. In some embodiments, the conductive material layer 520b may be formed by a plating process followed by a grinding process. In some embodiments, the plating process is, for example, electroplating, electroless plating, immersion plating, or the like. The grinding process includes, for example, a mechanical grinding process, a CMP process, or the like. However, the disclosure is not limited thereto. In some alternative embodiments, the grinding process may be omitted. The conductive material layer 520b includes, for example, copper, copper alloy, or another suitable conductive material.

Referring to FIG. 1N, the mask pattern M2 is removed. In some embodiments, the mask pattern M2 may be removed through a stripping process, an etching process, and/or a cleaning process. For example, the mask pattern M2 may be removed through applying chemicals such as dimethylsufoxide (DMSO), water ($H_2O$), and tetramethyl ammonium hydroxide (TMAH). In some embodiments, the TMAH compounds are able to break the cross-linkage of molecules within the mask pattern M2. The DMSO compounds are able to dissolve the molecules within the mask pattern M2. Upon removal of the mask pattern M2, a portion of the seed layer 520a covered by the mask pattern M2 in FIG. 1M is exposed. Subsequently, the exposed portion of the seed layer 520a is removed through an etching process. In some embodiments, the etching process may include an anisotropic etching process such as a dry etch or an isotropic etching process such as a wet etch. In some embodiments, an etchant for the wet etch includes a combination of hydrogen fluoride (HF), copper (Cu), and ammonia ($NH_3$), a combination of HF and TMAH, or the like.

In some embodiments, the conductive material layer 520b and the remaining seed layer 520a may be collectively referred to as conductive patterns 520 (or metal patterns 520). In other words, the conductive patterns 520 are formed to be in contact with the TIVs 200 and the molding layer 400. The conductive patterns 520 are connected to the conductive patterns 120 through the TIVs 200. In some embodiments, each conductive pattern 520 is formed to have a height $H_{520}$ between about 2 μm and about 50 μm. In some embodiments, each conductive pattern 520 has a width $W_{520}$ (shown in FIG. 4) between about 2 μm and about 50 μm, wherein the width $W_{520}$ is measured along a direction substantially perpendicular to a longitudinal direction of the conductive pattern 520. Two adjacent conductive patterns 520 may have between them a spacing $D_{520}$ (shown in FIG. 4) between about 2 μm and about 50 μm.

In some embodiments, some of the conductive patterns 120, some of the TIVs 200, and some of the conductive patterns 520 surround each of the permalloy cores 800 and may be collectively referred to as inductors ID. In some embodiments, the permalloy core 800 is referred to as a core of the inductor ID. In some embodiments, each inductor ID extends through the molding layer 400 and is at least partially disposed within the first redistribution structure 100 and the second redistribution structure 500. A number of the inductors ID depends on a number of the permalloy cores 800, and each of the permalloy cores 800 is surrounded or wound by an inductor ID. The configuration of the inductors ID with respect to the permalloy cores 800 will be discussed below in conjunction with FIGS. 4 and 5.

Figure 4:
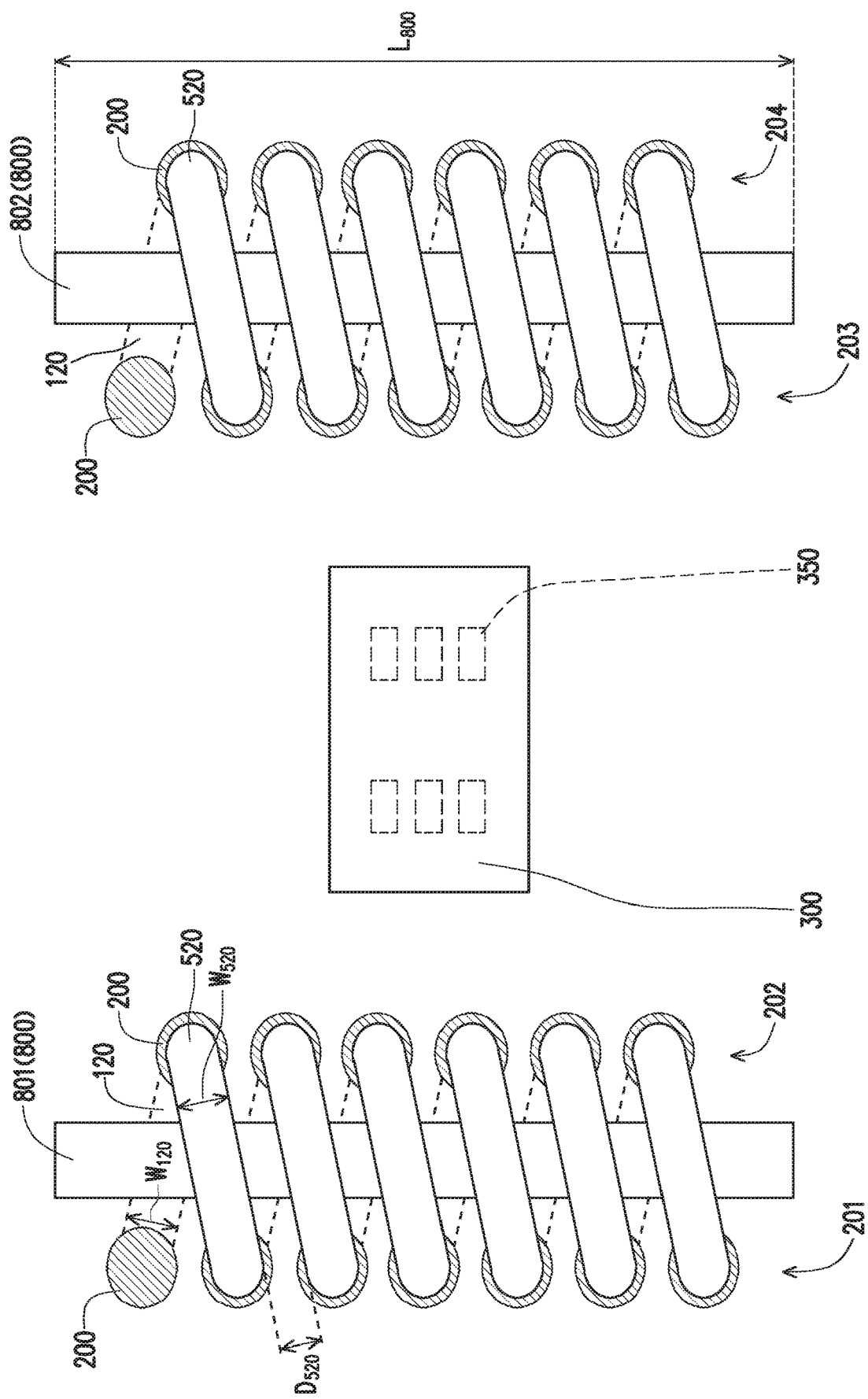
FIG. 4 is a schematic top view of the intermediate structure shown in FIG. 1N.
Figure 5:
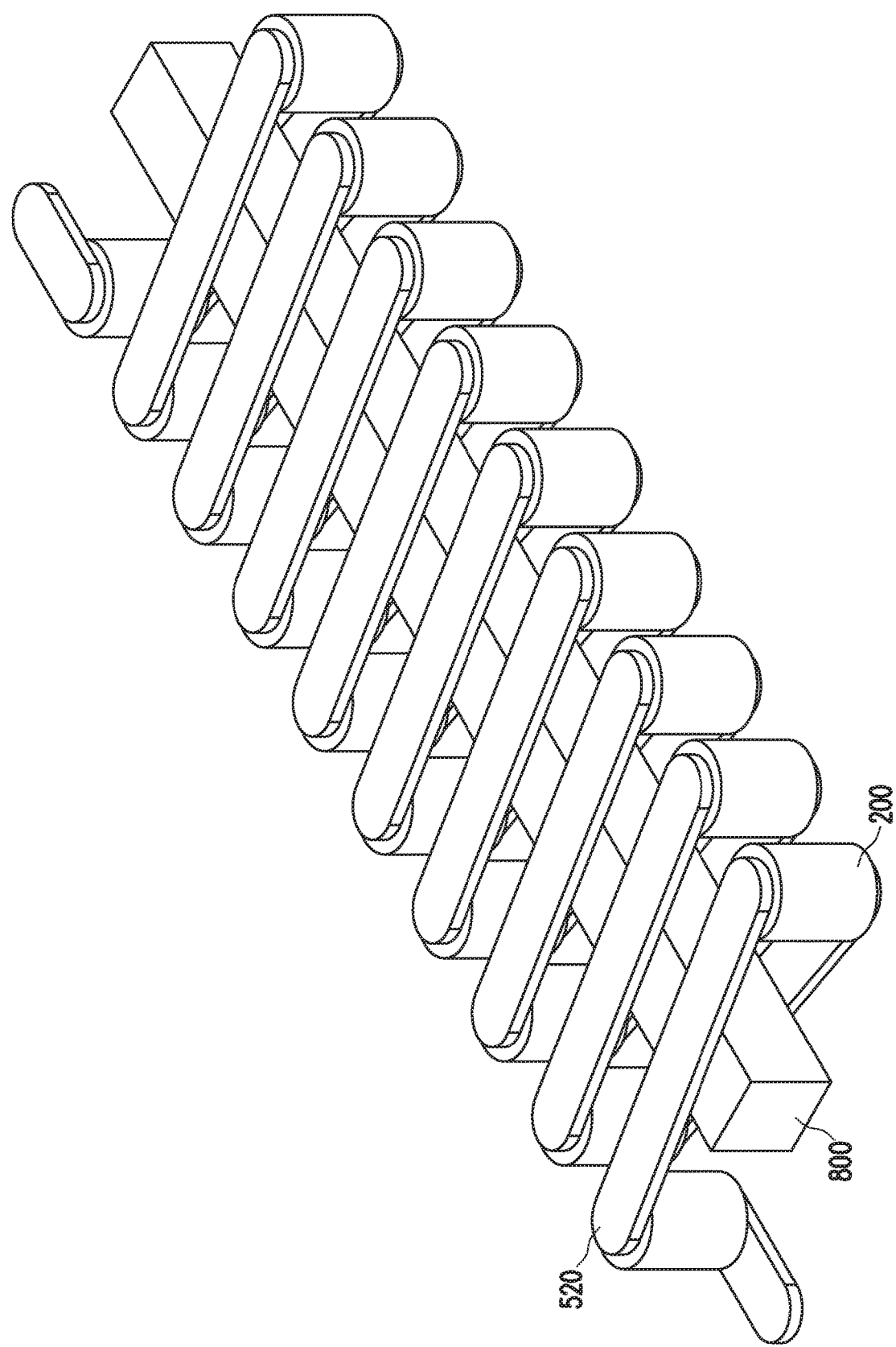
FIG. 5 is a schematic 3D view of the core and the inductor in accordance with some embodiments of the present disclosure.

FIG. 4 is a schematic top view and FIG. 5 is a schematic 3D view illustrating the inductor IDs and the permalloy cores 800 of the intermediate structure shown in FIG. 1N. The conductive patterns 120 are disposed under each permalloy core 800 and extend across the corresponding permalloy core 800. Similarly, the conductive patterns 520 are disposed over each permalloy core 800 and extend across the corresponding permalloy core 800. The conductive patterns 120, the TIVs 200, and the conductive patterns 520 form a coil of the inductors ID. The permalloy cores 800 are surrounded by the inductors ID. For example, a permalloy core 800 is inserted in the space enclosed by the spiral or the coil of the inductor ID. That is, the permalloy core 800 is confined within the space laid out by the conductive patterns 120, the TIVs 200, and the conductive patterns 520 of the inductor ID. In some embodiments, the permalloy core 801 is located between two adjacent TIVs 200 that are connected to the same conductive pattern 520 or the same conductive pattern 120. Similarly, the permalloy core 802 is also located between two adjacent TIVs 200 that are connected to the same conductive pattern 520 or the same conductive pattern 120. The permalloy core 800 is spaced apart from the inductor ID. In some embodiments, the permalloy core 800 is located on a plane between a plane where the conductive patterns 120 are located and a plane where the conductive patterns 520 are located.

As illustrated in FIGS. 4 and 5, each permalloy core 800 has a bar-shaped path and each inductor ID coils around the bar. Different permalloy cores 801 and 802 are separated by the molding layer 400. In other words, two opposite ends of the permalloy core 801 are in contact with the molding layer 400. Similarly, two opposite ends of the permalloy core 802 are also in contact with the molding layer 400. In the embodiments as shown in FIG. 4, the inductors ID are respectively disposed on two opposite sides and adjacent to two opposite sidewalls of the die 300, and substantially symmetrical with respect to the die 300. However, the present disclosure is not limited thereto. As illustrated in FIG. 5, a portion of the conductive pattern 120 may connected to a via 200 or an end of the inductor ID for providing an electrical path to the inductor ID, and a portion of the conductive pattern 520 may connected to another via 200 or the other end of the inductor ID.

As mentioned above, the distance D1 (shown in FIG. 3) between a permalloy core 800 and an adjacent TIV 200 in the lateral direction may be between about 5 µm and about 50 µm. A distance D2 (shown in FIG. 1N) between the permalloy core 800 and the conductive pattern 520 located above the permalloy core 800 in the vertical direction may be between about 5 µm and about 50 µm. Furthermore, a distance D3 (shown in FIG. 1N) between the permalloy core 800 and the conductive pattern 120 located underneath the permalloy core 800 in the vertical direction may be between about 5 µm and about 50 µm.

In some embodiments, the permalloy core 800 has a magnetic permeability ($\mu_m$) between about 500 and about 1,000,000 and a conductivity of about $7.41 \times 10^5$ siemens. The inductor ID has a conductivity between about $1 \times 10^7$ siemens and about $5.96 \times 10^7$ siemens. As a result, in some embodiments, the inductor ID incorporating the permalloy core 800 may have an inductance between about 30 nH and about 72.5 nH at a frequency of 100 MHz. In other words, with the high inductance derived from incorporation of the permalloy core 800 in the subsequently-formed package 10, the inductor ID may serve as a voltage regulator under high frequency to provide effective power management for high-frequency applicable electronic devices. Meanwhile, as illustrated in FIG. 1N, since the inductor ID is integrated within the subsequently-formed package 10, the compactness of the electronic device may be ensured. In addition, since formation of the inductor ID is performed together with formations of the first redistribution structure 100 and a second redistribution structure 500 subsequently formed in the package 10, the formation of the inductor ID can be highly integrated with a conventional process. Furthermore, by utilizing the conductive patterns in the redistribution structures and the TIVs as portions of the inductor ID, the fabrication process of the inductor ID may be readily simplified, thereby rendering an effective and economical manufacturing process.

Referring to FIG. 1O, a dielectric layer 512 and a plurality of routing patterns 522 are sequentially formed on the conductive patterns 520. In some embodiments, the dielectric layer 512 is formed to cover the conductive patterns 520. In other words, the conductive patterns 520 are embedded within the dielectric layer 512. In some embodiments, a material and a formation method of the dielectric layer 512 may be similar to those of the dielectric layer 112 and the dielectric layer 114, so repeated descriptions thereof are omitted herein.

As illustrated in FIG. 1O, the routing patterns 522 are formed on the dielectric layer 512. In some embodiments, each routing pattern 522 includes a seed layer 522a and a conductive material layer 522b stacked on the seed layer 522a. Materials and formation methods of the seed layer 522a and the conductive material layer 522b may be respectively similar to those of the seed layer 520a and the conductive material layer 520b, so repeated descriptions thereof are omitted herein. In some embodiments, the routing patterns 522 are electrically connected to the vias 350 and the conductive patterns 520. In other words, the routing patterns 522 are electrically connected to the die 300 and the inductors ID.

Referring to FIG. 1P, a dielectric layer 514, a plurality of routing patterns 524, and a dielectric layer 516 are sequentially formed on the routing patterns 522. In some embodiments, the dielectric layer 514 is formed to cover the routing patterns 522. In other words, the routing patterns 522 are sandwiched between the dielectric layer 512 and the dielectric layer 514. Similarly, the dielectric layer 516 is formed to cover the routing patterns 524. That is, the routing patterns 524 are sandwiched between the dielectric layer 514 and the dielectric layer 516. In some embodiments, materials and formation methods of the dielectric layer 514 and the dielectric layer 516 may be similar to those of the dielectric layer 512, so repeated descriptions thereof are omitted herein.

As illustrated in FIG. 1P, the routing patterns 524 are formed on the dielectric layer 514. In some embodiments, each routing pattern 524 includes a seed layer 524a and a conductive material layer 524b stacked on the seed layer 524a. Materials and formation methods of the seed layer 524a and the conductive material layer 524b may be respectively similar to those of the seed layer 522a and the conductive material layer 522b, so repeated descriptions thereof are omitted herein. In some embodiments, the routing patterns 524 are electrically connected to the routing patterns 522.

Referring to FIG. 1Q, a plurality of under-ball metallurgy (UBM) patterns 526 and a plurality of conductive terminals 600 are sequentially formed over the dielectric layer 516 and the routing patterns 524. In some embodiments, the dielectric layer 516 has a plurality of openings OP4 exposing the routing patterns 524. The UBM patterns 526 extend into the openings OP4 of the dielectric layer 516 to be directly in contact with the routing patterns 524. In other words, the UBM patterns 526 are electrically connected to the routing patterns 524. In some embodiments, a material and a formation method of the UBM patterns 526 may be similar to those of the routing patterns 522 and 524, so repeated descriptions thereof are omitted herein.

In some embodiments, the conductive patterns 520, the dielectric layer 512, the routing patterns 522, the dielectric layer 514, the routing patterns 524, the dielectric layer 516, and the UBM patterns 526 are collectively referred to as a second redistribution structure 500. As illustrated above, the second redistribution structure 500 may include a portion (i.e., the conductive patterns 520) of the inductor ID. In other words, a top portion of the inductor ID may be considered as embedded in the bottommost dielectric layer (e.g., the dielectric layer 512) of the second redistribution structure 500. As illustrated in FIG. 1Q, the second redistribution structure 500 is disposed over the TIVs 200, the die 300, the permalloy cores 800 and the molding layer 400. The molding layer 400 is located between the first redistribution structure 100 and the second redistribution structure 500. In some embodiments, the second redistribution structure 500 may be referred to as a front-side redistribution structure. It should be noted that the number of the conductive patterns 520, the routing patterns 522, 524, the UBM patterns 526, and the dielectric layers 512, 514, 516 illustrated in FIG. 1Q are merely for illustrative purposes, and the disclosure is not limited thereto. In some alternative embodiments, more layers of routing patterns and more layers of dielectric layers may be formed depending on the circuit design. When more layers of routing patterns and more layers of dielectric layers are adapted, these routing patterns and these dielectric layers are stacked alternately, and the routing patterns may be interconnected with one another.

As illustrated in FIG. 1Q, the conductive terminals 600 are disposed on the UBM patterns 526. In some embodiments, the conductive terminals 600 are attached to the UBM patterns 526 through a solder flux. In some embodiments, the conductive terminals 600 are, for example, solder balls. In some embodiments, the conductive terminals 600 may be disposed on the second redistribution structure 500 through a ball placement process and/or a reflowing process.

Referring to FIG. 1R, after the conductive terminals 600 are mounted on the second redistribution structure 500, the de-bonding layer DB and the substrate C are removed from the first redistribution structure 100. In some embodiments, the de-bonding layer DB (e.g., the LTHC release layer) may be irradiated by a UV laser such that the substrate C and the de-bonding layer DB may be peeled off from the dielectric layer 112. However, the de-bonding process is not limited thereto. Other suitable de-substrate methods may be used in some alternative embodiments. Thereafter, a singulation process is performed to form a plurality of packages 10. In some embodiments, the dicing process or the singulation process typically involves dicing with a rotating blade or a laser beam. In other words, the dicing or singulation process is, for example, a laser cutting process, a mechanical cutting process, or another suitable process. In some embodiments, the package 10 may be referred to as an integrated fan-out (InFO) package. However, the disclosure is not limited thereto. In some alternative embodiments, the package 10 may be another type of package.

The above-illustrated package 10 includes two permalloy cores 800 and two inductors ID respectively surrounding the two permalloy cores 800 at two opposite sides of the die 300. However, the present disclosure is not limited thereto. In order to further illustrate the concept of the present disclosure, various embodiments are provided in the following description accompanied by figures. For ease of illustration, in the following description, only differences from the previous embodiments are illustrated. In addition, the present disclosure may repeat reference numerals and/or letters in the various examples. This repetition is for the purpose of simplicity and clarity and does not in itself dictate a relationship between the various embodiments and/or configurations discussed.

Figure 6:
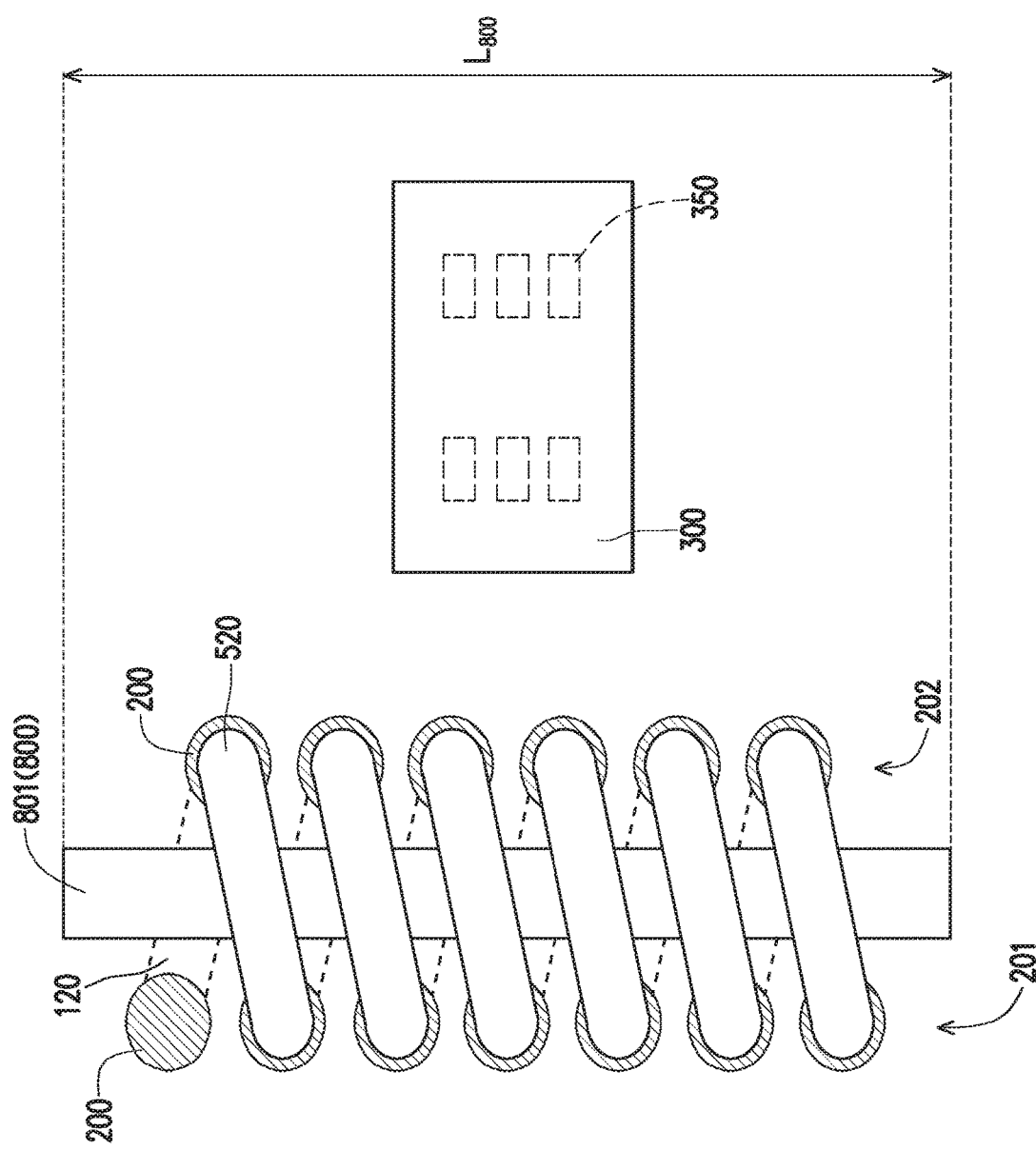
Figure 8:
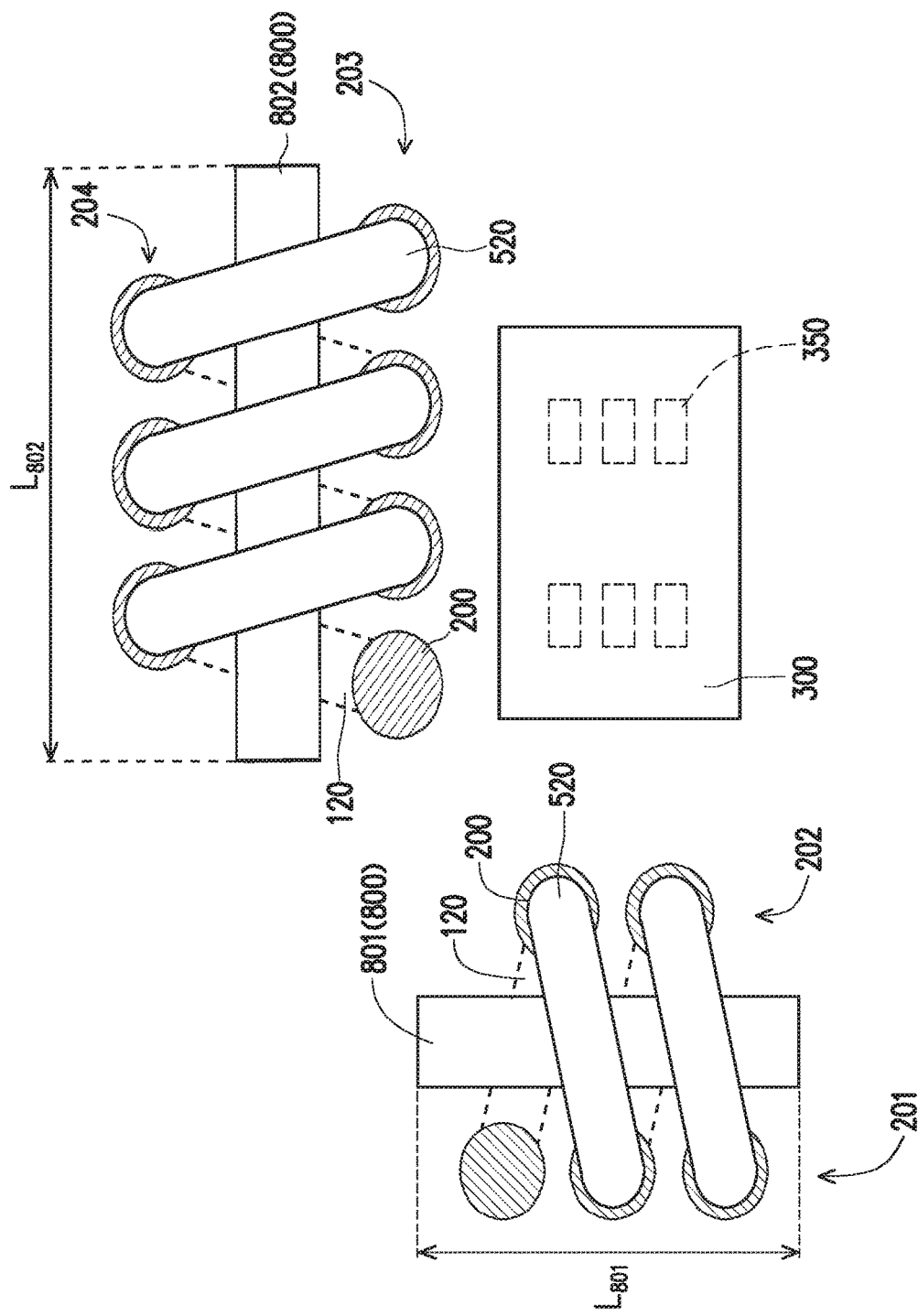

FIGS. 6 to 8 are schematic top views illustrating the inductor ID and the permalloy cores 800 in accordance with different embodiments of the present disclosure. Referring to FIG. 6, a package 11 is similar to the package 10 but only includes the permalloy core 801 and the corresponding inductor ID coiling around the permalloy core 801. The permalloy core 800 and the inductor ID are disposed on one side of the die 300 and adjacent to one sidewall of the die 300. In the embodiments shown in FIG. 6, the permalloy core 800 and the inductor ID are similar to the permalloy core 801 and the corresponding inductor ID of the package 10. The length $L_{800}$ of the permalloy core 800 of the package 11 is substantially the same as the length $L_{800}$ of the permalloy core 800 of the package 10.

Referring to FIG. 7, a package 12 is similar to the package 10 but with a shorter permalloy core 801 and a smaller number of the TIVs 200 of the first group 201 and the second group 202. In other words, the length $L_{801}$ of the permalloy core 801 of the package 12 is less than the length $L_{801}$ of the permalloy core 801 of the package 10. In addition, the number of the TIVs 200 of the first group 201 of the package 12 is less than the number of the TIVs 200 of the first group 201 of the package 10. Similarly, the number of the TIVs 200 of the second group 202 of the package 12 is less than the number of the TIVs 200 of the second group 202 of the package 10. The numbers of TIVs 200 respectively in the first and second groups 201 and 202 depend on the length $L_{801}$ of the permalloy core 801 and a number of coil turns of the inductor ID, and are not limited herein.

Referring to FIG. 8, a package 13 is similar to the package 10, but with a shorter permalloy core 801 and with the second permalloy core 802 being substantially perpendicular to the first permalloy core 801. The permalloy core 801 and the corresponding inductor ID of the package 13 are similar to those of the package 12. In the embodiments, the first permalloy core 801 and the second permalloy core 802 are disposed at two adjacent sides of the die 300. In addition, the length $L_{802}$ of the second permalloy core 802 of the package 13 is less than the length $L_{802}$ of the second permalloy core 802 of the package 10. The number of the TIVs 200 of the third group 203 of the package 13 is also less than the number of the TIVs 200 of the third group 203 of the package 10. Similarly, the number of the TIVs 200 of the fourth group 204 of the package 13 is less than the number of the TIVs 200 of the fourth group 204 of the package 10.

In accordance with some embodiments of the disclosure, a package includes a first redistribution structure, a die, a permalloy structure, a molding material, a second redistribution structure, and a plurality of through vias. The first redistribution structure includes a first metal pattern. The die is disposed over the first redistribution structure. The molding material is disposed over the first redistribution structure and surrounds the die and the permalloy structure. The second redistribution structure is disposed over the die, the permalloy structure and the molding material, and includes a second metal pattern. The plurality of through vias penetrates the molding material and connects the first metal pattern to the second metal pattern. The permalloy structure includes a first member and a second member isolated from the first member, the first member and the second member are surrounded by the plurality of through vias and sandwiched between the first metal pattern and the second metal pattern.

In accordance with some embodiments of the disclosure, a package includes a first redistribution structure, a second redistribution structure, a molding structure, a die, and a first inductor. The molding structure is disposed between the first redistribution structure and the second redistribution structure. The first inductor is disposed between the first redistribution structure and the second redistribution structure and adjacent to a first sidewall of the die. The first inductor includes a first permalloy core, disposed in the molding structure; and a first coil structure, winding the first permalloy core, extending through the molding structure and at least partially disposed within the first redistribution structure and the second redistribution structure.

In accordance with some embodiments of the disclosure, a method for forming a package includes at least the following operations. A first redistribution structure is formed, wherein the first redistribution structure includes a first metal pattern. A plurality of vias is formed over the first redistribution structure. A die is placed over the first redistribution structure. A permalloy structure is placed over the first redistribution structure between the plurality of vias, wherein the permalloy structure includes a first member and a second member separated from the first member. A molding material is disposed over the first redistribution structure to surround the permalloy structure, the plurality of vias and the die. A second redistribution structure is formed over the molding material, wherein the second redistribution structure includes a second metal pattern. Each of the first member and the second member is wound by the plurality of vias, the first metal pattern and the second metal pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:
a first redistribution structure, including a first metal pattern and a dielectric layer covering the first metal pattern, wherein the first metal pattern is separated from a top surface of the first redistribution structure by the dielectric layer;
a die, disposed on the top surface of the first redistribution structure;
a permalloy structure, disposed on the top surface of the first redistribution structure;
a molding material, disposed over the first redistribution structure and surrounding the die and the permalloy structure;
a second redistribution structure, disposed over the die, the permalloy structure and the molding material, and including a second metal pattern; and
a plurality of through vias, penetrating the molding material and the top surface of the first redistribution structure, and connecting the first metal pattern to the second metal pattern,
wherein the permalloy structure includes a first member and a second member isolated from the first member, the first member and the second member are surrounded by the plurality of through vias and sandwiched between the first metal pattern and the second metal pattern, and the first member elongates substantially in parallel to a side of the die from a top view perspective.

2. The package of claim 1, wherein the permalloy structure comprises nickel (Ni), iron (Fe), cobalt (Co), molybdenum (Mo), silicon (Si), niobium (Nb), boron (B), or a combination thereof.

3. The package of claim 1, wherein a magnetic permeability ($\mu_m$) of the permalloy structure is between 500 and 1,000,000.

4. The package of claim 1, wherein the first member or the second member of the permalloy structure has a straight bar configuration from the top view perspective.

5. The package of claim 1, wherein a width of the first member and a width of the second member are respectively in a range of 5-50 micrometers.

6. The package of claim 1, wherein the first member and the second member are elongated laterally over the first redistribution structure.

7. The package of claim 6, wherein the first member and the second member are elongated parallel to each other.

8. The package of claim 1, further comprising an adhesive layer disposed between the permalloy structure and the first redistribution structure.

9. A package, comprising:
a first redistribution structure;
a second redistribution structure;
a molding structure, disposed between the first redistribution structure and the second redistribution structure;
a die, encapsulated in the molding structure; and
a first inductor, disposed between the first redistribution structure and the second redistribution structure and adjacent to a first side wall of the die, and comprising:
a first permalloy core, disposed in the molding structure; and
a first coil structure, winding the first permalloy core, extending through the molding structure and at least partially disposed within the first redistribution structure and the second redistribution structure, wherein the first permalloy core elongates substantially in parallel to a side of the die from a top view perspective, the first coil structure includes a plurality first conductive lines disposed below the first permalloy core and within the first redistribution structure, and the plurality of first conductive lines are separated from a top surface of the first redistribution structure.

10. The package of claim 9, wherein the first coil structure comprises:
a plurality of first vias, penetrating the molding structure and disposed on two opposite sides of the first permalloy core, wherein each of the plurality of first vias includes an upper portion disposed in the molding structure and a lower portion disposed in the dielectric layer, and a width of the upper portion is greater than a width of the lower portion;
the plurality of first conductive lines, extending across the first permalloy core; and
a plurality of second conductive lines, disposed in the second redistribution structure and extending across the first permalloy core.

11. The package of claim 9, further comprises:
a second inductor, disposed between the first redistribution structure and the second redistribution structure and adjacent to a second sidewall of the die.

12. The package of claim 11, wherein the first inductor is separated from the second inductor, and the first sidewall is opposite to the second sidewall.

13. The package of claim 11, wherein the first inductor is separated from the second inductor, and the first sidewall is adjacent to the second sidewall.

14. The package of claim 11, wherein the second inductor comprises:
a second permalloy core, disposed in the molding structure; and
a second coil structure, winding the second permalloy core.

15. The package of claim 11, wherein the second inductor and the first inductor are substantially symmetrical with respect to the die.

16. The package of claim 11, wherein the second permalloy core has a length different from a length of the first permalloy core.

17. The package of claim 11, wherein the second inductor is separated from the first inductor by the molding structure.

18. The package of claim 11, further comprises:
a third inductor, disposed between the first redistribution structure and the second redistribution structure and separated from the first inductor and the second inductor by the molding structure.

19. A package, comprising:
a first dielectric layer;
a first conductive structure, disposed in and covered by the first dielectric layer, wherein a top surface of the first conductive structure is below a top surface of the first dielectric layer;
a die, disposed over the first dielectric layer;
a permalloy core, disposed over the first dielectric layer and adjacent to the die;
a first via, disposed between the die and the permalloy core, wherein the first via penetrates an upper portion of the first dielectric layer above the first conductive structure and connects the first conductive structure;
a second via, disposed opposite to the first via with respect to the permalloy core, wherein the second via penetrates the upper portion of the first dielectric structure and connects the first conductive structure;
a second dielectric layer, disposed over the first via, the second via and the permalloy core; and
a second conductive structure, disposed in the second dielectric layer and electrically connecting the first via and the second via, wherein the first via, the second via, and the second conductive structure are separated from the permalloy core.

20. The package of claim 19, wherein the permalloy core is attached to a surface of the first dielectric layer, and the first via and the second via penetrate the surface of the first dielectric layer.

* * * * *

UNITED STATES PATENT AND TRADEMARK OFFICE
CERTIFICATE OF CORRECTION

PATENT NO. : 12,002,770 B2
APPLICATION NO. : 16/787644
DATED : June 4, 2024
INVENTOR(S) : Hsu et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 731 days.

Signed and Sealed this
Twenty-fourth Day of June, 2025

Coke Morgan Stewart
*Acting Director of the United States Patent and Trademark Office*